United States Patent
Umamichi et al.

(10) Patent No.: US 7,733,164 B2
(45) Date of Patent: Jun. 8, 2010

(54) SEMICONDUCTOR DEVICE WITH DECOUPLING CAPACITANCE CONTROLLED AND CONTROL METHOD FOR THE SAME

(75) Inventors: Takashi Umamichi, Kanagawa (JP); Katsunori Shirai, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 14 days.

(21) Appl. No.: 11/847,768

(22) Filed: Aug. 30, 2007

(65) Prior Publication Data

US 2008/0055018 A1 Mar. 6, 2008

(30) Foreign Application Priority Data

Sep. 1, 2006 (JP) .............................. 2006-237698

(51) Int. Cl.
*H03B 1/00* (2006.01)
*H03K 5/00* (2006.01)
*H04B 1/10* (2006.01)

(52) U.S. Cl. .................. 327/551; 327/90; 327/310; 327/311

(58) Field of Classification Search ......... 327/309–330, 327/55, 77–99, 551
See application file for complete search history.

(56) References Cited

U.S. PATENT DOCUMENTS

2003/0098742 A1* 5/2003 Nakagawa et al. .......... 327/551
2005/0017767 A1* 1/2005 Huang et al. ............... 327/110

FOREIGN PATENT DOCUMENTS

JP 2002-246548 A 8/2002
JP 2004-86881 A 3/2004

OTHER PUBLICATIONS

The magazine of Nikkei Electronics (Jul. 18, 2005 pp. 115-127).
JST failure knowledge database: case name "a large power supply noise is generated in a power supply layer due to resonance of a print circuit board" (http://shippai.jst.go.jp/fkd/Detail?fn=0&id=CA0000078&).

* cited by examiner

Primary Examiner—Lincoln Donovan
Assistant Examiner—Brandon S Cole
(74) Attorney, Agent, or Firm—Sughrue Mion, PLLC

(57) ABSTRACT

In a semiconductor device, a monitoring circuit monitors and detects a quantity of noise in the semiconductor device. A control circuit has capacitances and controls connections to the capacitances such a decoupling capacitance value provided between a first power supply and a second power supply is dynamically adjusted based on the detected noise quantity.

6 Claims, 30 Drawing Sheets

REFERENCE CLOCK SIGNAL

INTERNAL CLICK SIGNAL

INPUT TO COUNTER

SEMICONDUCTOR DEVICE WITH DECOUPLING CAPACITANCE CONTROLLED AND CONTROL METHOD FOR THE SAME

BACKGROUND OF THE INVENTION

1. Field of the Invention

The present invention relates to a semiconductor device, and more particularly to a semiconductor device having a noise suppressing circuit using a decoupling capacitor.

2. Description of the Related Art

A capacitor of a large capacitance is generally connected to a power supply to reduce a power supply noise. However, in a report of the magazine of Nikkei Electronics (2005.7.18 pp. 115-127), it is described that "different from technical common sense, when the capacitance of a decoupling capacitor is increased, power supply noise increases". Like this case, there is a possibility that the noise can be suppressed, by increasing or decreasing the capacitance of the decoupling capacitor. Also, in a JST failure knowledge database: case name "a large power supply noise is generated in a power supply layer due to resonance of a print circuit board" (http://shippai.jst.go.jp/fkd/Detail?fn=0&id=CA0000078&), it is described that "it is generally difficult to estimate the frequency of the board". In other words, it is desirable to dynamically control a decoupling capacitance in accordance with each frequency.

In conjunction with the above description, a semiconductor device is disclosed in Japanese Laid Open Patent Application (JP-P2002-246548A). This conventional semiconductor device has a bypass capacitor of a MOS structure which has a gate electrode and which is formed on a diffusion region of a conductive type through a capacitive insulating film below a power supply wiring area, and a substrate contact which is formed below a ground wiring area to fix a substrate voltage. A bypass capacitor has a contact connected with a power supply wiring line in the gate electrode surface, and the diffusion region of the conductive type and a diffusion region of the substrate contact are connected. Thus, in this conventional semiconductor device, the number of through-holes for decoupling capacitances to be connected is changed on layout. Also, it is possible to select a bypass capacitor to be used in accordance with an operation frequency.

Also, a semiconductor integrated circuit design supporting apparatus is disclosed in Japanese Laid Open Patent Application (JP-P2004-086881A). In this conventional LSI design technique, a gate level logic circuit data, a standard cell library data and a package data of a circuit block of an LSI chip are provided, and a noise analysis process of the LSI chip is executed by using these data. It the noise generation quantity is within a predetermined range, the process is ended. When the noise generation quantity exceeds a predetermined range, one of logic gates in the circuit block is selected, and a bypass capacitor is added to the selected logic gate.

However, in the above conventional techniques, since a layout is fixed, the capacitance cannot be changed dynamically.

SUMMARY

In a first embodiment of the present invention, a semiconductor device includes a monitoring circuit and a control circuit. The monitoring circuit monitors and detects a quantity of noise in the semiconductor device. The control circuit has capacitances and controls connections to the capacitances such a decoupling capacitance value provided between a first power supply and a second power supply is dynamically adjusted based on the detected noise quantity.

In another embodiment of the present invention, a method of suppressing noise in a semiconductor device is achieved by monitoring and detecting a quantity of noise in the semiconductor device; and by controlling connections to capacitances such a decoupling capacitance value provided between a first power supply and a second power supply is dynamically adjusted based on the detected noise quantity.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, a semiconductor device according to embodiments of the present invention will be described in detail with reference to the attached drawings.

First Embodiment

Figure 1:
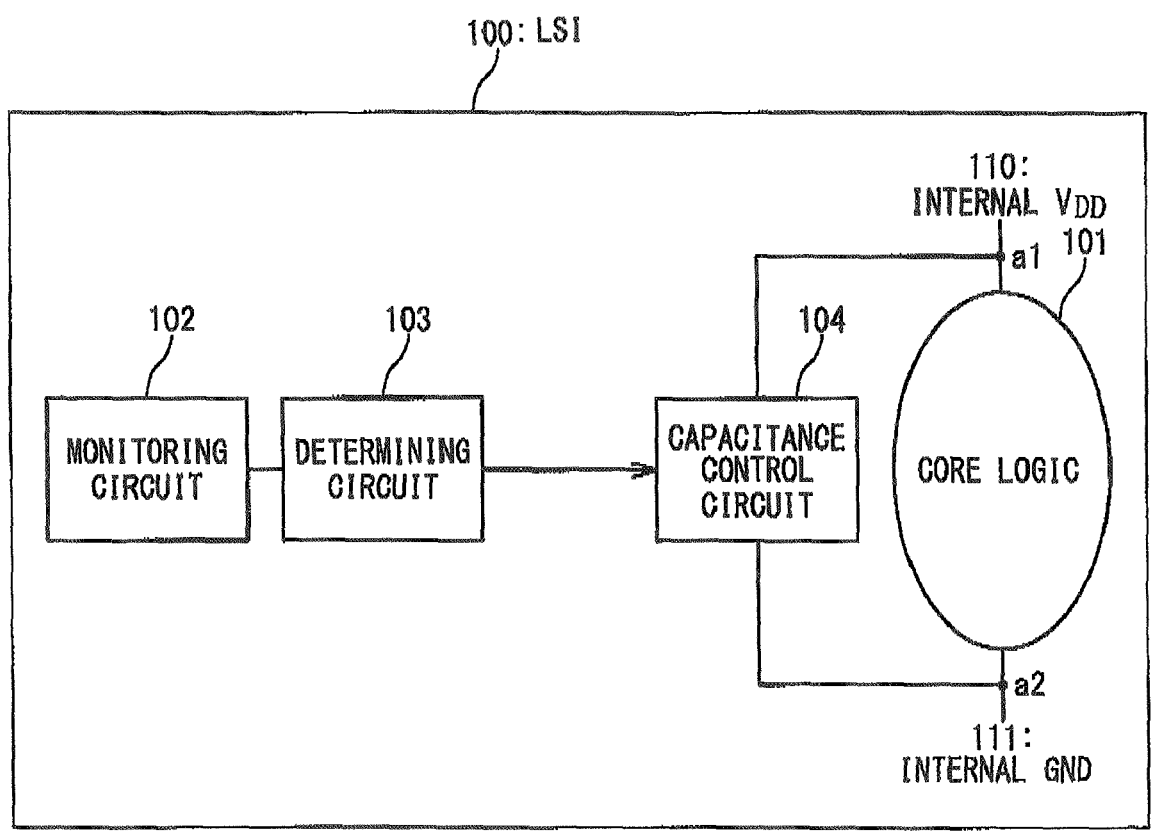
FIG. 1 is a block diagram showing a configuration of a semiconductor device according to a first embodiment of the present invention.

The semiconductor device according to a first embodiment of the present invention will be described with reference to the attached drawings. FIG. 1 is a schematic diagram of the semiconductor device with a power supply noise suppressing circuit provided in an LSI. The LSI 100 is composed of a core LOGIC section 101, a monitoring circuit 102, a determining circuit 103 and a capacitance control circuit 104.

The core LOGIC section 101 is provided between an internal power supply line VDD 110 and an internal ground line GND 111. The monitoring circuit 102 is connected with the determining circuit 103. The determining circuit 103 is connected with the capacitance control circuit 104. The capacitance control circuit 104 is connected with a node a1 between the core LOGIC section 101 and the internal power supply line VDD 110 and is connected with a node a2 between the core LOGIC section 101 and the internal ground line GND 111. That is, the capacitance control circuit 104 is provided between the internal power supply line VDD 110 and the internal ground line GND 111 in parallel with the core LOGIC section 101.

The monitoring circuit 102, the determining circuit 103 and the capacitance control circuit 104 function as a noise suppressing circuit. A specific example of the monitoring circuit 102, the determining circuit 103 and the capacitance control circuit 104 are shown below.

Figure 2:
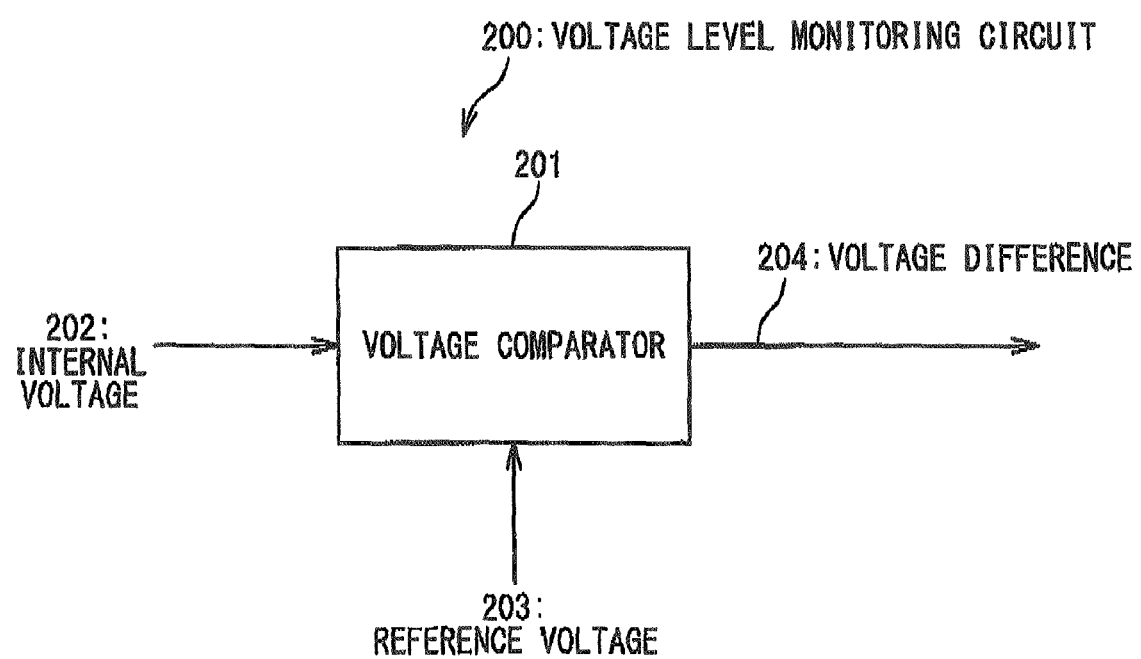
FIG. 2 is a block diagram showing a configuration of a monitoring circuit in the semiconductor device according to the first embodiment of the present invention.

FIG. 2 shows a voltage level monitoring circuit 200 as an example of the monitoring circuit 102. The voltage level monitoring circuit 200 is composed of a voltage comparator 201 and an A/D converter (not shown). In this embodiment, the A/D converter is provided since a digital circuit is provided at a later stage. However, if the later stage is an analogue circuit, the A/D converter may be omitted. The voltage comparator 201 outputs a voltage difference 204 between an internal voltage 202 and a reference voltage 203. The internal voltage 202 is a voltage detected from an optional portion of the LSI when the optional portion is monitored. The reference voltage 203 is an ideal voltage from another power supply. The A/D converter converts the voltage difference 204 into a digital data.

Figure 3:
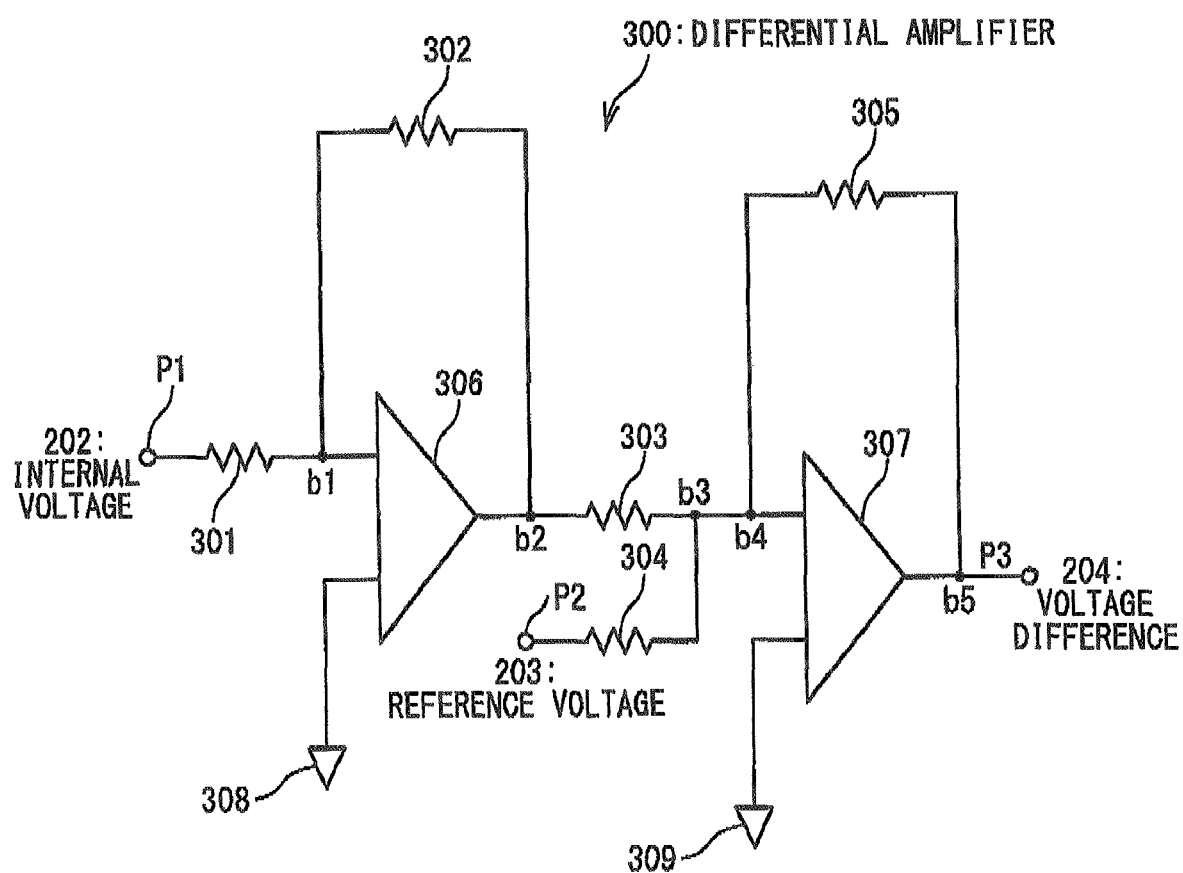
FIG. 3 is a circuit diagram showing a configuration of the monitoring circuit in the semiconductor device of the first embodiment.

FIG. 3 shows the details of voltage comparator 201 shown in FIG. 2. The voltage comparator 201 is composed of a differential amplifier 300. The differential amplifier 300 is composed of resistances 301 to 305, and operational amplifiers 306 and 307. The resistance 301 is provided between a port p1 and a node b1. The internal voltage 202 is applied to the port p1. The resistance 302 is provided between the node b1 and a node b2. The resistance 303 is provided between the node b2 and a node b3. The resistance 304 is provided between a port p2 and the node b3. The reference voltage 203 is supplied to the port p2. The node b3 and a node b4 are connected. The resistance 305 is provided between the node b4 and a node b5. The operational amplifier 306 is provided between the node b1 and the node b2 in parallel with the resistance 302. Also, one of two input terminals of the operational amplifier 306 is connected with a power supply terminal 308. The terminal may be connected to a grounding terminal (GND) instead of the power supply terminal. The operational amplifier 307 is provided between the node b4 and the node b5 in parallel with the resistance 305. Also, one of two input terminals of the operational amplifier 307 is connected with power supply terminal 309. The terminal may be connected to a ground terminal (GND) instead of the power supply terminal. The node b5 and the port p3 are connected to each other. The voltage difference 204 between the internal voltage 202 and the reference voltage 203 is outputted from the port p3.

Figure 4:
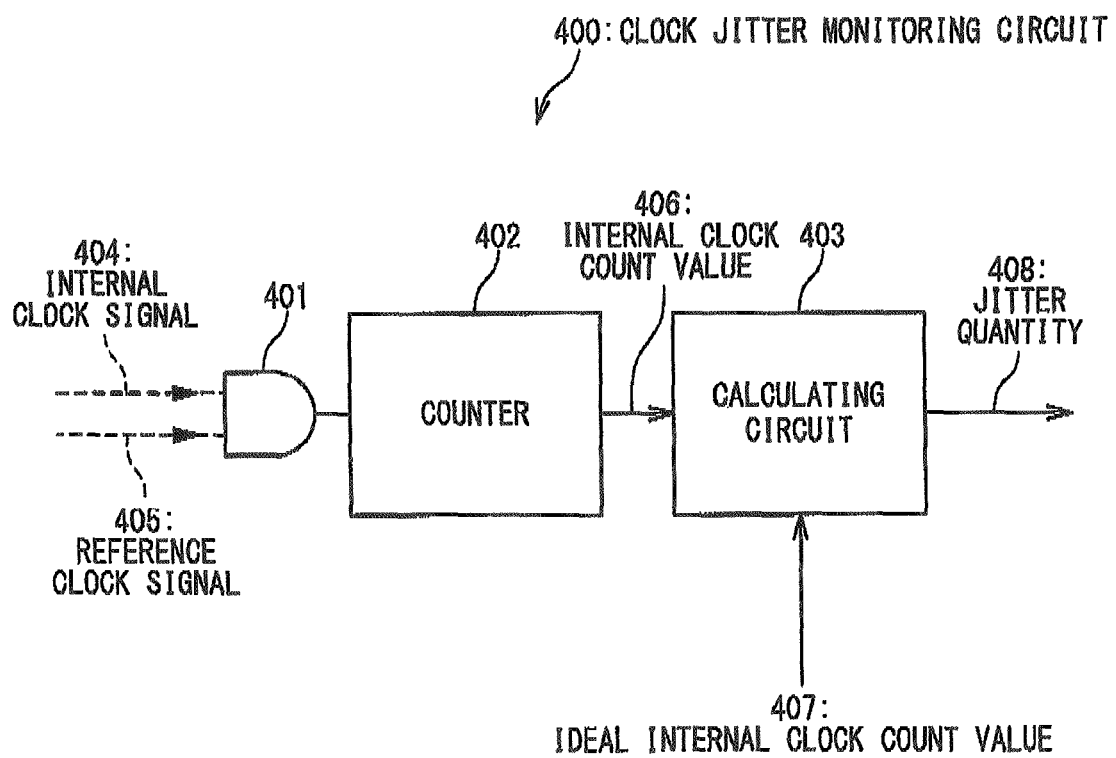
FIG. 4 is a block diagram showing a configuration of a clock jitter monitoring circuit in the semiconductor device according to the first embodiment of the present invention.

FIG. 4 shows a clock jitter monitoring circuit 400 as another example of the monitoring circuit 102. The clock jitter monitoring circuit 400 is composed of an AND gate 401, a counter 402 and a calculating circuit 403. The AND gate 401 receives an internal clock signal 404 and a reference clock signal 405, and outputs a logical production of them to the counter 402. Although the AND gate 401 is used, a logical circuit such as a NAND gate may be used in place of the AND gate. The internal clock signal 404 is a clock signal extracted from an optional portion of the LSI, and the reference clock signal 405 supplied from another power supply system and having an ideal waveform. The frequency of the reference clock signal 405 is high sufficiently compared with the internal clock signal 404, and the AND gate 401 outputs the reference clock signal for a period during which the internal clock signal is active. The counter 402 counts the reference clock signal outputted from the AND gate 401 and outputs an internal clock count value 406 to the calculating circuit. The calculating circuit 403 receives the internal clock count value 406 and an ideal internal clock count value 407 to calculate a difference between them and outputs a jitter quantity 408 corresponding to the difference. The ideal internal clock count value 407 is set externally in advance. The ideal internal clock count value 407 is a count value when the ideal internal clock signal is counted by using the reference clock signal 405.

Figure 5:
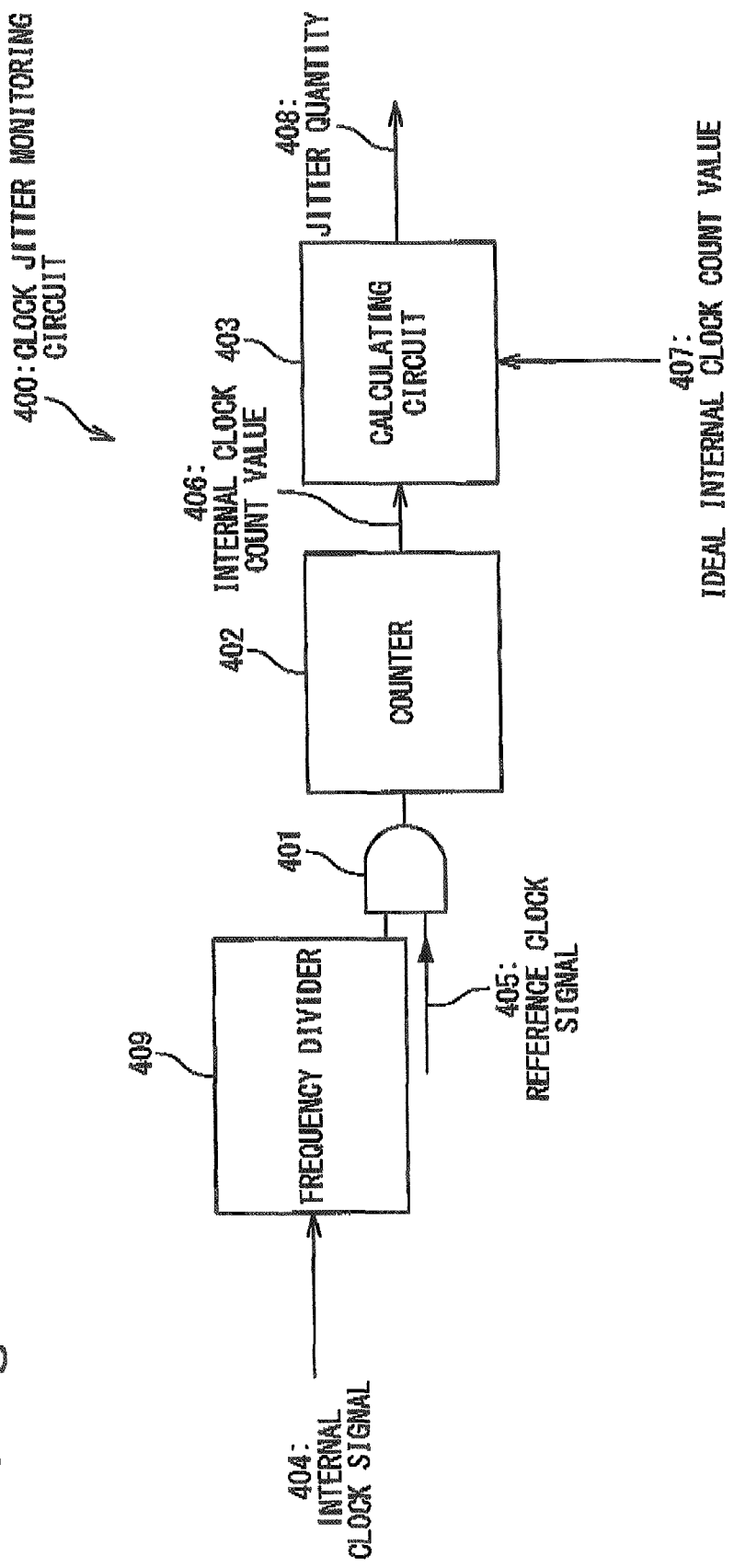
FIG. 5 is a block diagram showing a configuration of a modification of the clock jitter monitoring circuit in the semiconductor device.

Also, FIG. 5 shows a modification of the clock jitter monitoring circuit 400 in which a frequency divider 409 is inserted between the AND gate 401 and the internal clock signal 404. The clock jitter monitoring circuit 400 shown in FIG. 5 is composed of the AND gate 401, the counter 402, the calculating circuit 403 and the frequency divider 409. The frequency divider 409 frequency divides the internal clock signal 404 and outputs the frequency divided internal clock signal. The AND gate 401 outputs the reference clock signal 405 for a time period during which the frequency divider 409 is active, to the counter 402. The other components and operation are same as those in FIG. 4.

Figure 6:
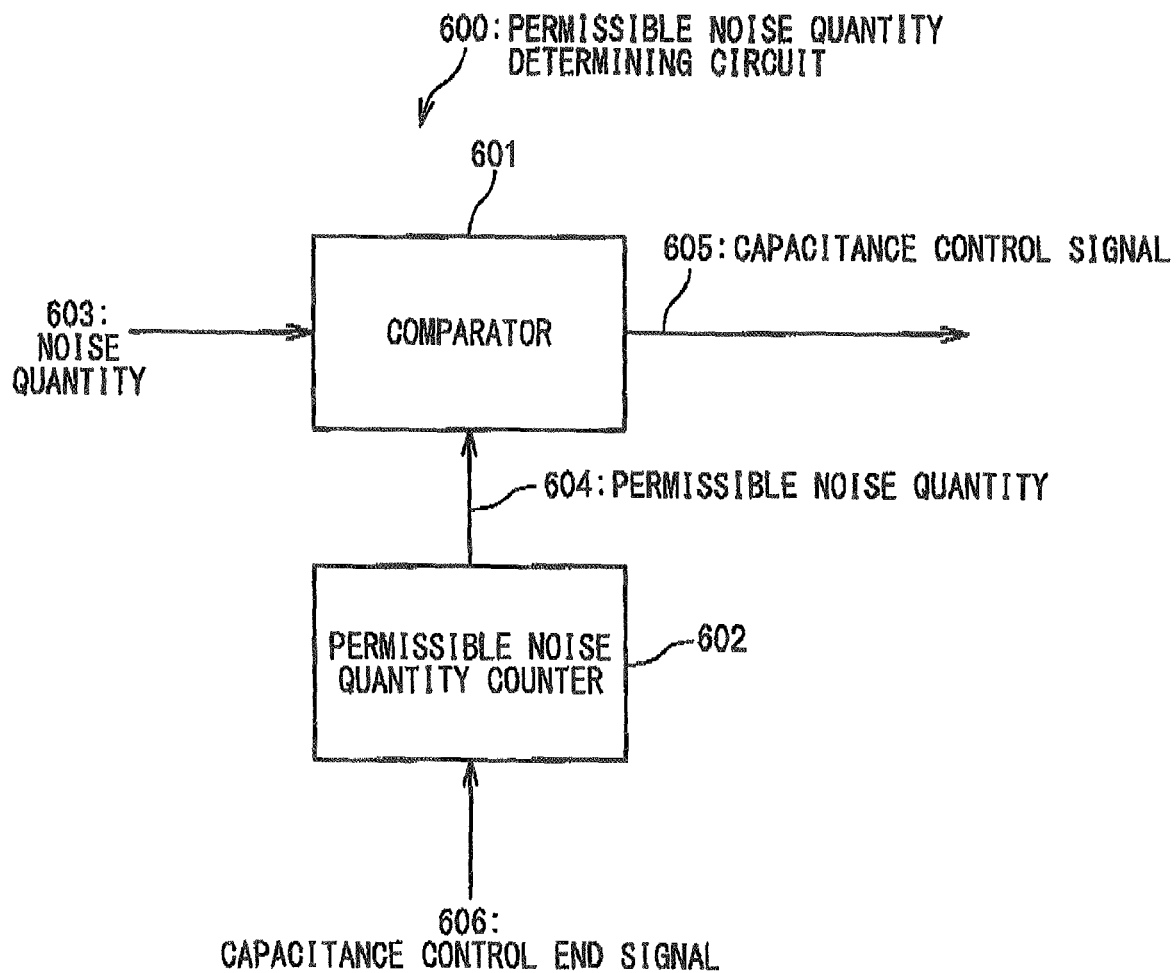
FIG. 6 is a block diagram showing a configuration of a determining circuit in the semiconductor device according to the first embodiment of the present invention.

FIG. 6 shows a configuration of a permissible noise quantity determining circuit 600 as an example of the determining circuit 103. The permissible noise quantity determining circuit 600 is composed of a comparator 601 and a permissible noise quantity counter 602. The comparator 601 receives a noise quantity 603 and a permissible noise quantity 604 and outputs a capacitance control signal 605 based on a difference between them. The permissible noise quantity counter 602 receives a capacitance control end signal 606 and outputs the permissible noise quantity 604 to the comparator 601.

Figure 7:
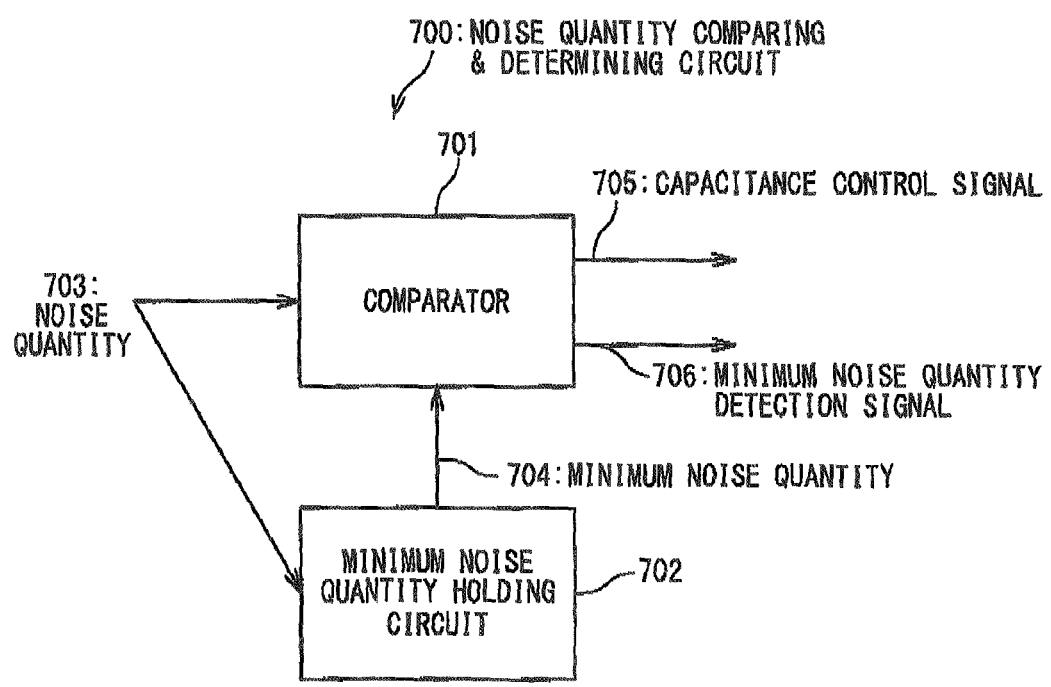
FIG. 7 is a block diagram showing a configuration of a modification of the determining circuit.

Also, FIG. 7 shows a noise quantity comparing and determining circuit 700 as another example of the determining circuit 103. The noise quantity comparing and determining circuit 700 is composed of a comparator 701 and a minimum noise quantity holding circuit 702. The comparator 701 receives a noise quantity 703 and a minimum noise quantity 704 and outputs a capacitance control signal 705 and a minimum noise detection signal 706. The minimum noise quantity holding circuit 702 receives the noise quantity 703 and outputs the minimum noise quantity 704 to the comparator 701.

Figure 8:
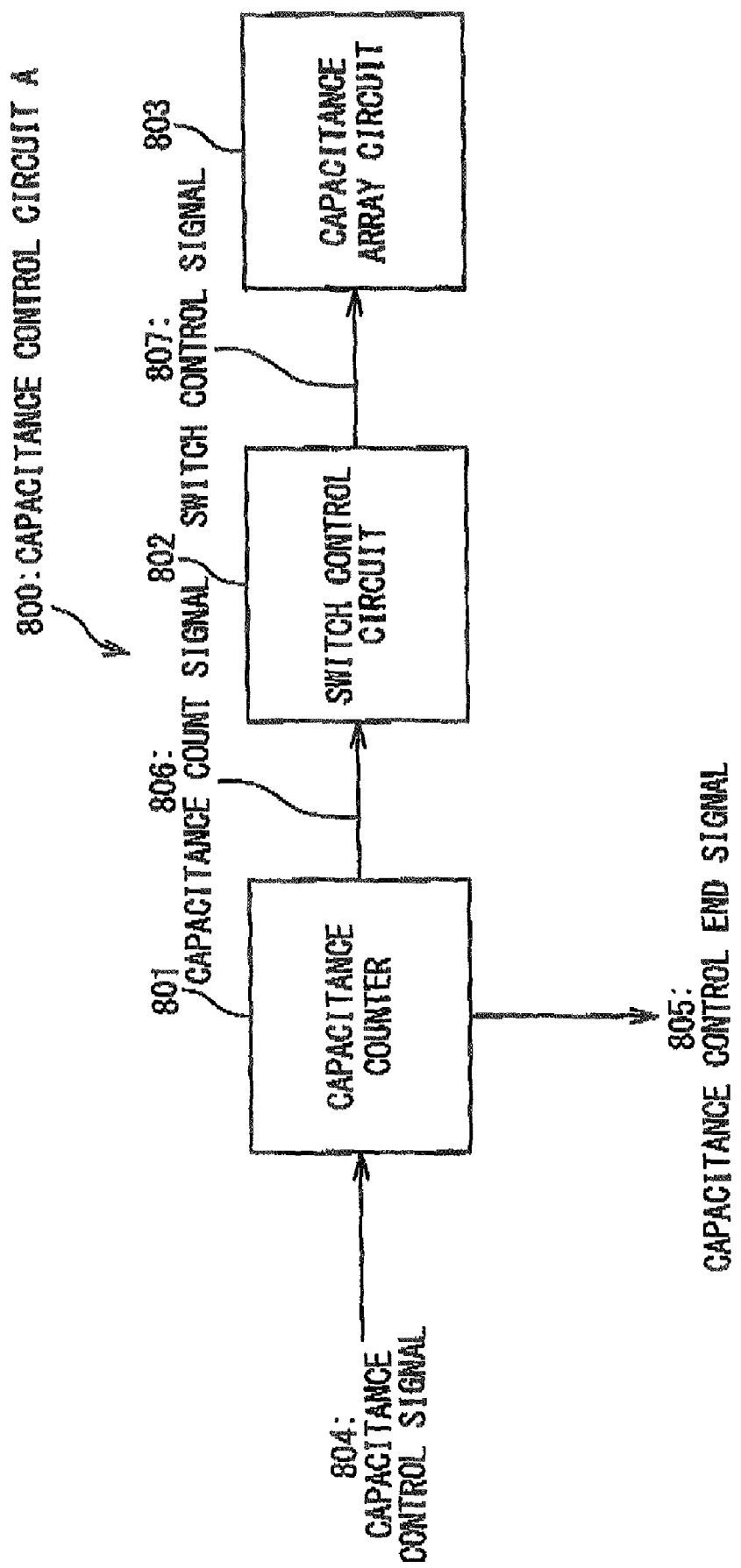
FIG. 8 is a block diagram showing a configuration of a capacitance control circuit in the semiconductor device according to the first embodiment of the present invention.

FIG. 8 shows a capacitance control circuit A 800 as an example of the capacitance control circuit 104. The capacitance control circuit A 800 is suitable for the permissible noise quantity determining circuit 600, and is composed of a capacitance counter 801, a switch control circuit 802 and a capacitance array circuit 803. The capacitance counter 801 receives a capacitance control signal 804 and outputs a capacitance count signal 806 and a capacitance control end signal 805. It should be noted that in the following embodiments, the capacitance counter 801 includes a sampling clock generating circuit (not shown) therein. The capacitance control signal 804 is sampled in response to a sampling clock signal generated by the sampling clock generating circuit, and the capacitance counter is counted up based on a sampled value. The details of the sampling operation will be described later. The switch control circuit 802 receives the capacitance count signal 806 and outputs a switch control signal 807. The capacitance array circuit 803 receives the switch control signal 807.

Figure 9:
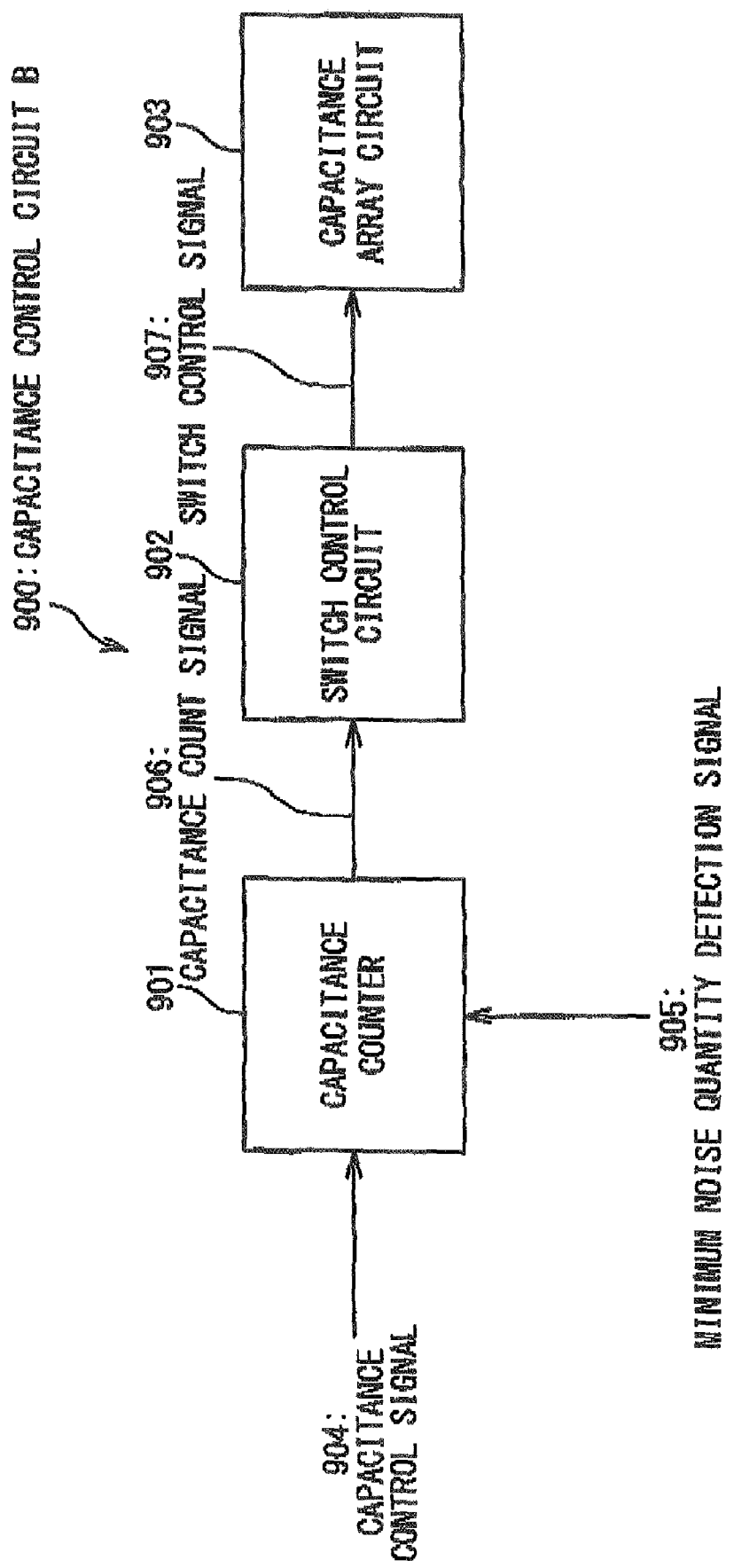
FIG. 9 is a block diagram showing a configuration of a modification of the capacitance control circuit.

FIG. 9 shows a capacitance control circuit B 900 as another example of the capacitance control circuit 104. The difference of the circuit B 900 from the capacitance control circuit A 800 is in that the capacitance control end signal 805 is omitted and a minimum noise detection signal 905 is added to the capacitance counter 901. The capacitance control circuit B 900 (capacitance control circuit 104) is composed of a capacitance counter 901, a switch control circuit 902 and a capacitance array circuit 903. The capacitance counter 901 inputs a capacitance control signal 904 and a minimum noise detection signal 905 and outputs a capacitance count signal 906. The switch control circuit 902 inputs a capacitance count signal 906 and outputs the switch control signal 907. The capacitance array circuit 903 inputs the switch control signal 907.

Figure 10:
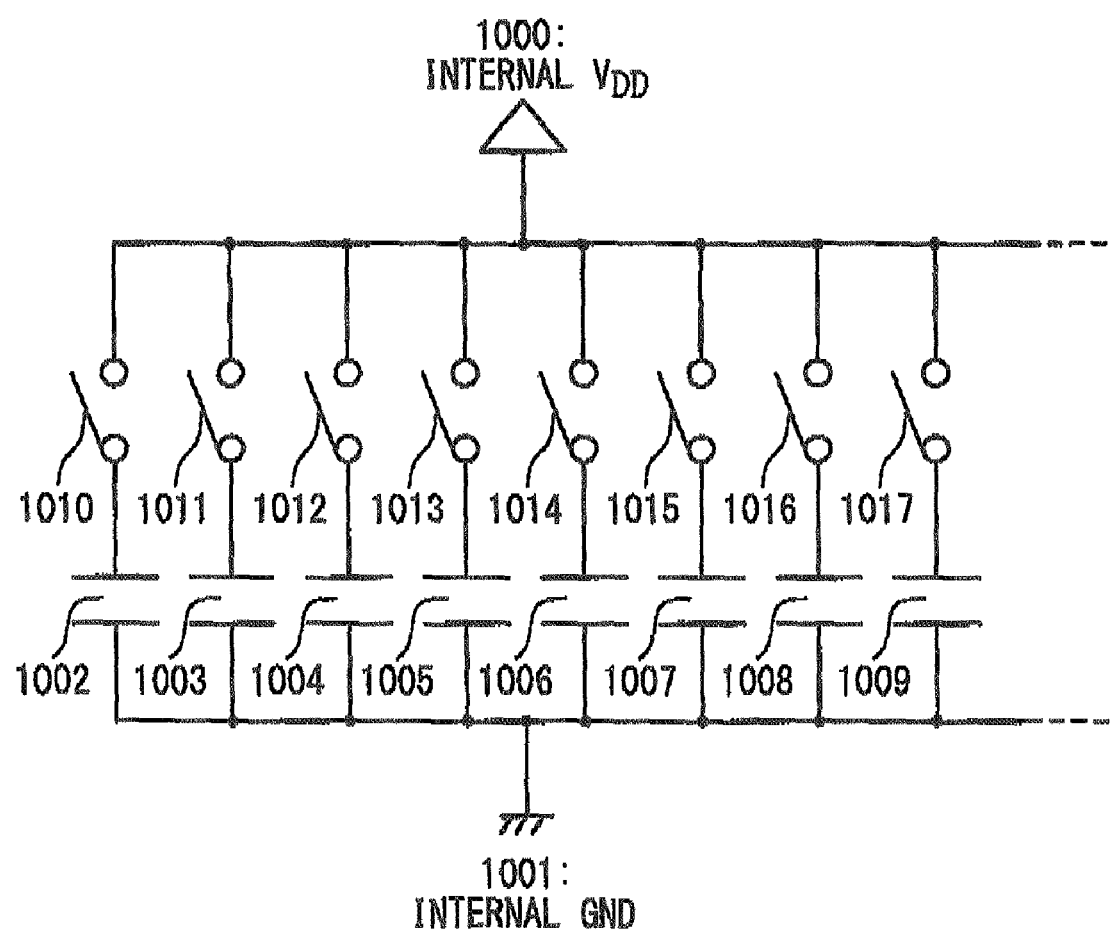
FIG. 10 is a block diagram showing a configuration of details of a decoupling capacitance.

FIG. 10 shows the capacitance array circuits 803 and 903. Each of the capacitance array circuits 803 and 903 is provided with a plurality of serial connections of a switch and a decoupling capacitance between a first power supply and a second power supply.

Here, the capacitance array circuit 803, 903 is composed of decoupling capacitances 1002 to 1009 and switches 1010 to 1017. They are provided between an internal power supply line VDD 1000 (the first power supply) and an internal ground line GND 1001 (the second power supply). The decoupling capacitances 1002 to 1009 and switches 1010 to 1017 are connected. For example, the decoupling capacitance 1002 and the switch 1010 are connected and the decoupling capacitance 1009 and the switch 1017 are connected.

Figure 11:
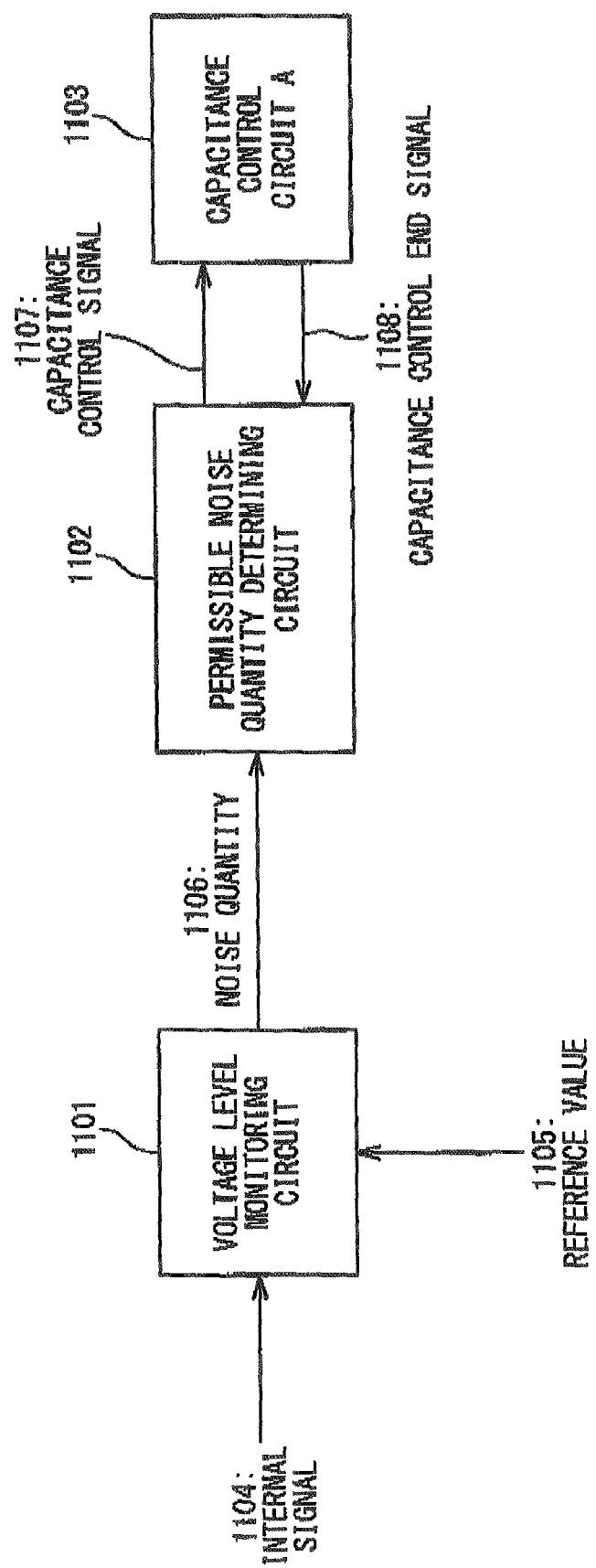
FIG. 11 is a block diagram showing a configuration of the semiconductor device according to a second embodiment of the present invention.

Next, the noise suppressing circuit in the semiconductor device according to a first embodiment of the present invention will be described. FIG. 11 shows the noise suppressing circuit in the semiconductor device according to the first embodiment of the present invention, and the noise suppressing circuit is composed of a voltage level monitoring circuit 1101, a permissible noise quantity determining circuit 1102 and a capacitance control circuit A 1103. The voltage level monitoring circuit 1101 inputs an internal signal 1104 and a reference signal 1105 and outputs a noise quantity 1106. The permissible noise quantity determining circuit 1102 inputs the noise quantity 1106 and outputs a capacitance control signal 1107 to the capacitance control circuit A 1103. The capacitance control circuit A 1103 inputs the capacitance control signal 1107 and outputs a capacitance control end signal 1108 to the permissible noise quantity determining circuit 1102.

Figure 12:
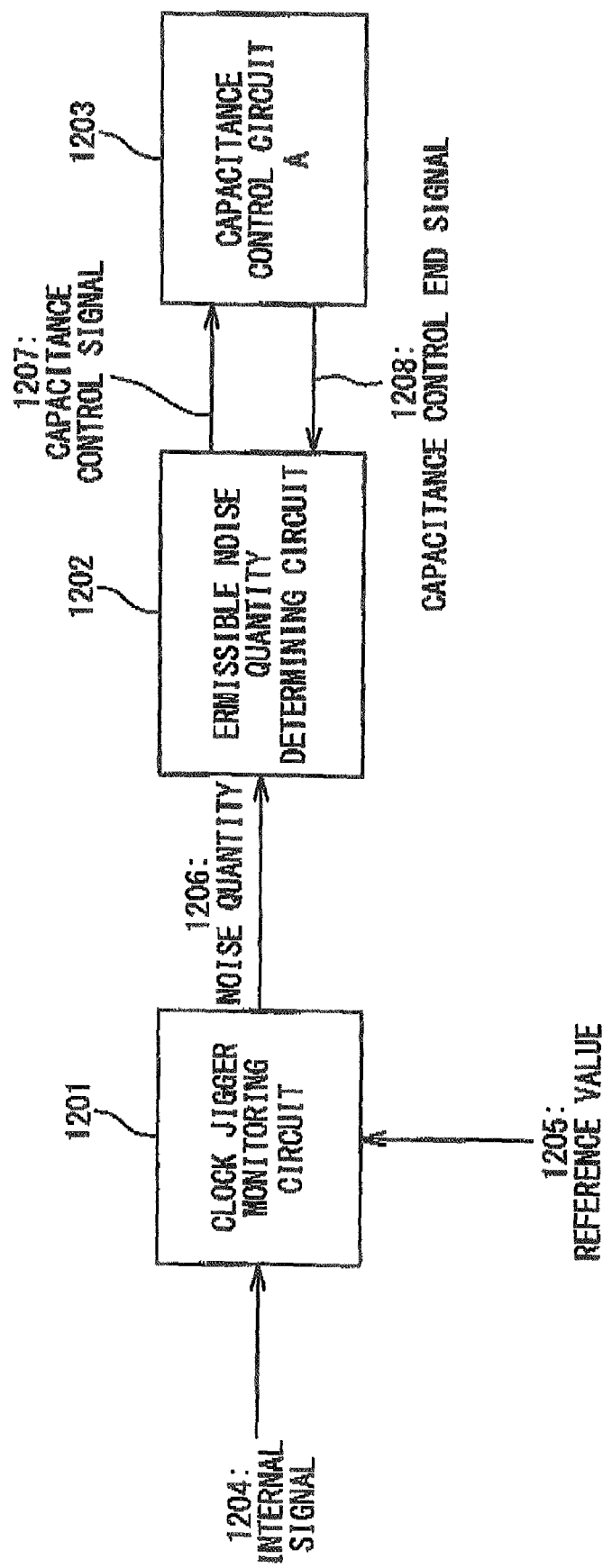
FIG. 12 is a block diagram showing a configuration of the semiconductor device according to a third embodiment of the present invention.

FIG. 12 shows a circuit composed of a clock jitter monitoring circuit 1201, a permissible noise quantity determining circuit 1202, and a capacitance control circuit A 1203 as a second embodiment. The clock jitter monitoring circuit 1201 inputs an internal signal 1204 and a reference signal 1205 and outputs A noise quantity 1206. The permissible noise quantity determining circuit 1202 inputs the noise quantity 1206 and outputs a capacitance control signal 1207 to the capacitance control circuit A 1203. The capacitance control circuit A 1203 inputs a capacitance control signal 1207 and outputs a capacitance control end signal 1208 to the permissible noise quantity determining circuit 1202.

Figure 13:
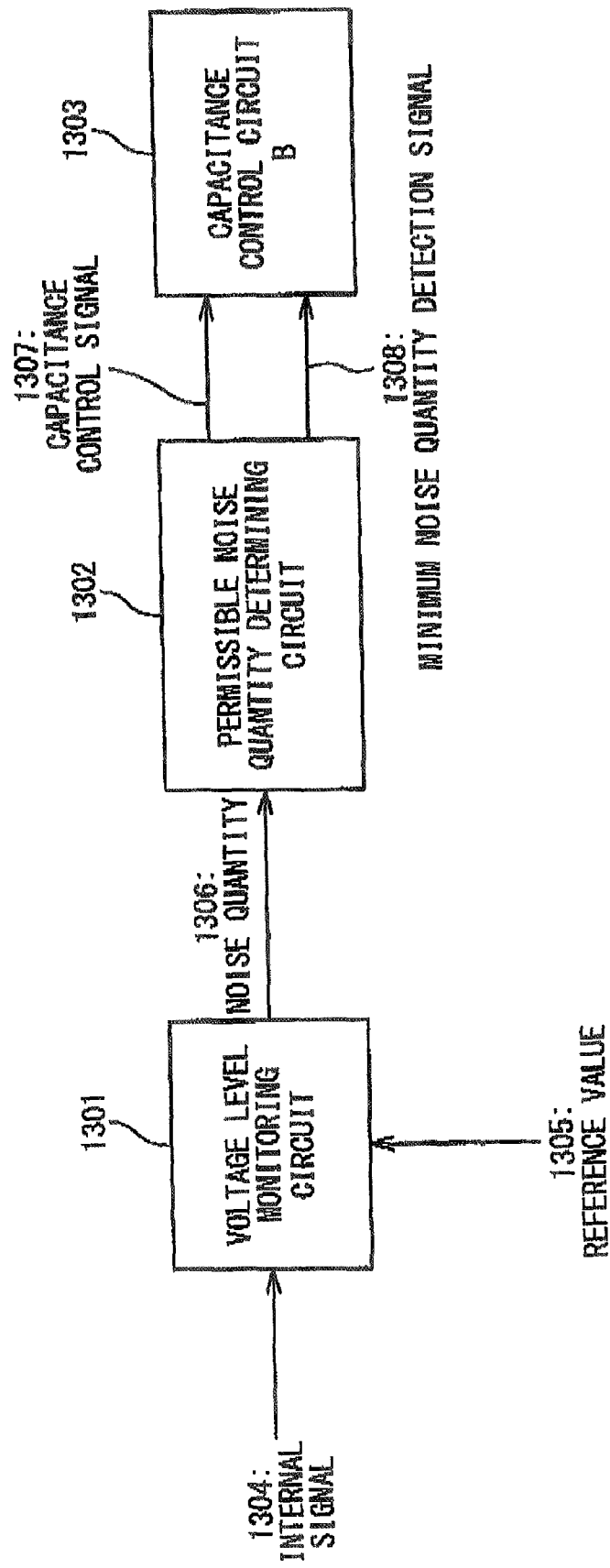
FIG. 13 is a block diagram showing a configuration of the semiconductor device according to a fourth embodiment of the present invention.

FIG. 13 shows a circuit composed of a voltage level monitoring circuit 1301, a noise quantity determining circuit 1302 and a capacitance control circuit B 1303 as a third embodiment. The voltage level monitoring circuit 1301 inputs an internal signal 1304 and a reference signal 1305 and outputs a noise quantity 1306. The noise quantity determining circuit 1302 inputs the noise quantity 1306 and outputs a capacitance control signal 1307 and a minimum noise detection signal 1308 to a capacitance control circuit B 1303.

Figure 14:
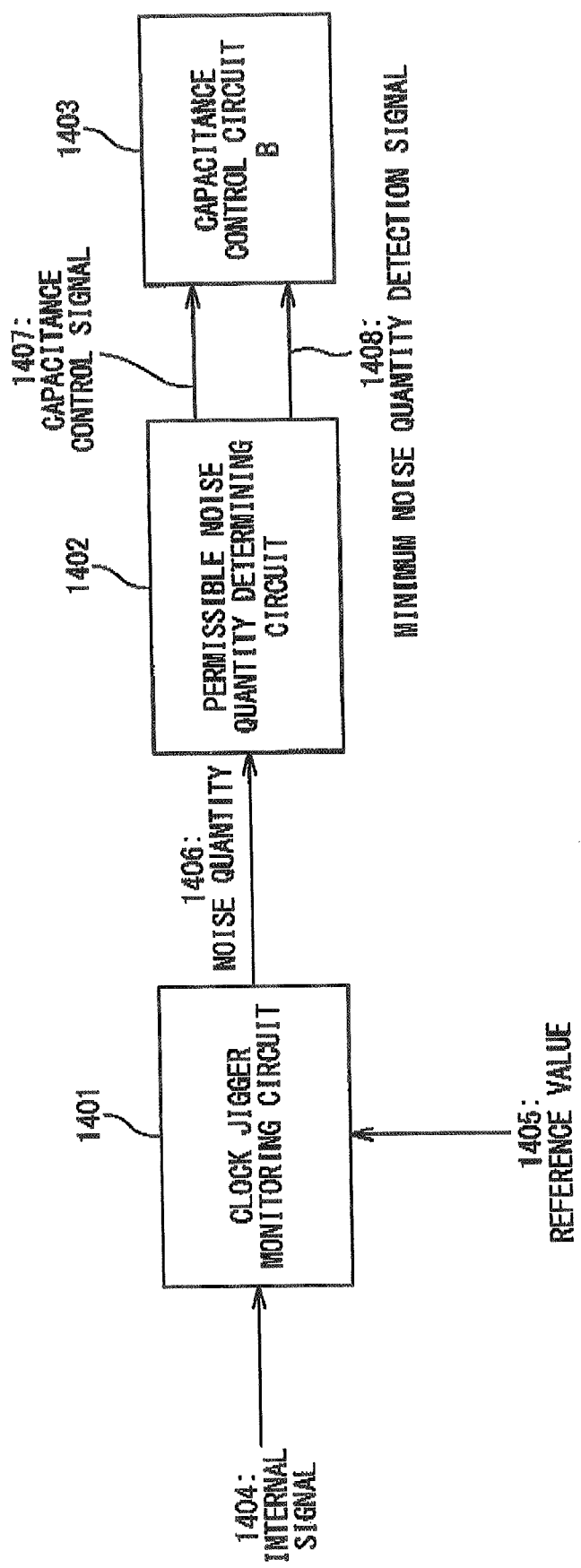
FIG. 14 is a block diagram showing a configuration of the semiconductor device according to a fifth embodiment of the present invention.

FIG. 14 shows a circuit composed of a clock jitter monitoring circuit 1401, a noise quantity comparing and determining circuit 1402 and a capacitance control circuit B 1403 as a fourth embodiment. The clock jitter monitoring circuit 1401 inputs an internal signal 1404 and a reference signal 1405 and outputs a noise quantity 1406. The noise quantity determining circuit 1402 inputs the noise quantity 1406 and outputs a capacitance control signal 1407 and a minimum noise detection signal 1408 to the capacitance control circuit B 1403.

Figure 15:
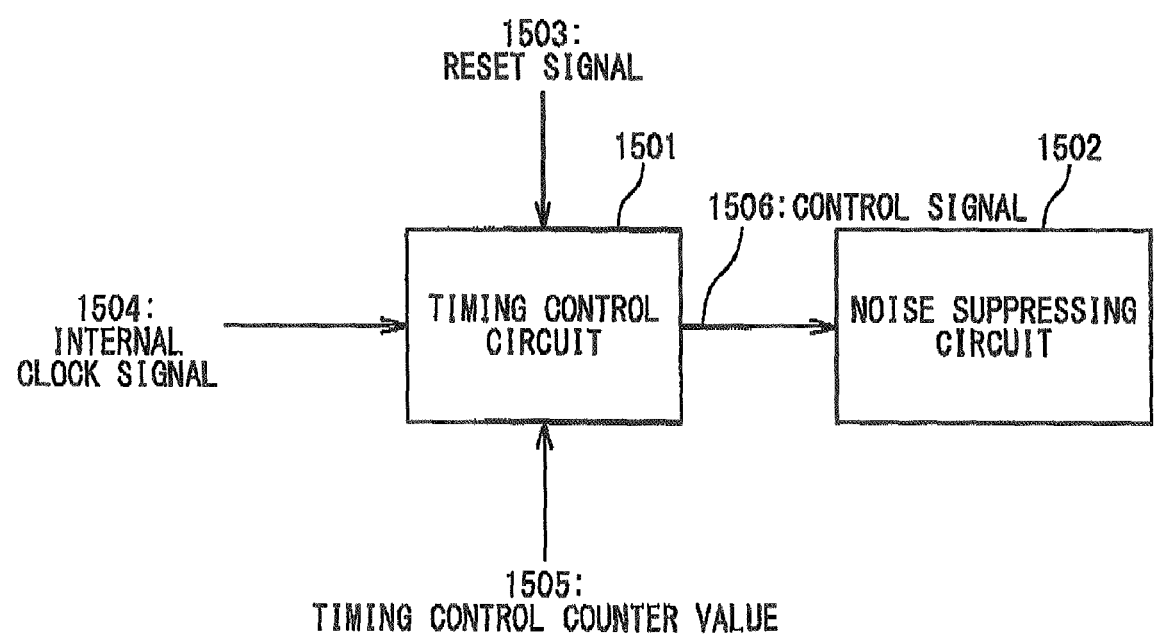
FIG. 15 is a block diagram showing a configuration of the semiconductor device according to a sixth embodiment of the present invention.
Figure 16:
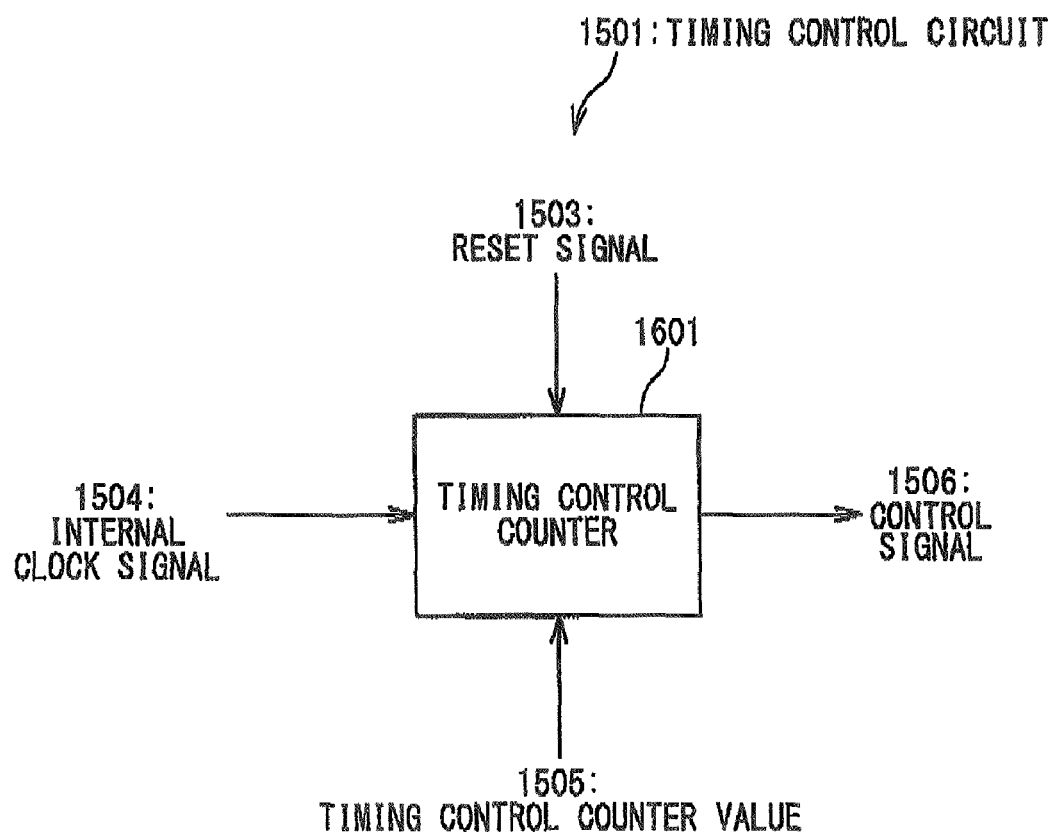
FIG. 16 is a block diagram showing a configuration of the details of a timing control circuit in the semiconductor device of the sixth embodiment.

FIG. 15 shows a timing control circuit 1501 in a fifth embodiment which is connected with a noise suppressing circuit 1502. The timing control circuit 1501 inputs a reset signal 1503, an internal clock signal 1504 and a timing control count value 1505 and outputs a control signal 1506 to the noise suppressing circuit 1502. FIG. 16 shows the details of timing control circuit 1501. AS shown in FIG. 16, the timing control circuit 1501 is composed of a counter 1601 for timing control. The counter 1601 inputs a reset signal 1503, an internal clock signal 1504 and a count value 1505 and outputs a control signal 1506. It should be noted that an optional value may be set as the count value 1505.

Next, examples in which the monitoring circuit, the determining circuit and the capacitance control circuit are arranged in an LSI, an SiP (System in Package) and a general semiconductor device will be described as a sixth embodiment. It should be noted that the circuit configuration of other than the circuit arrangements are not changed from the above description.

Figure 17:
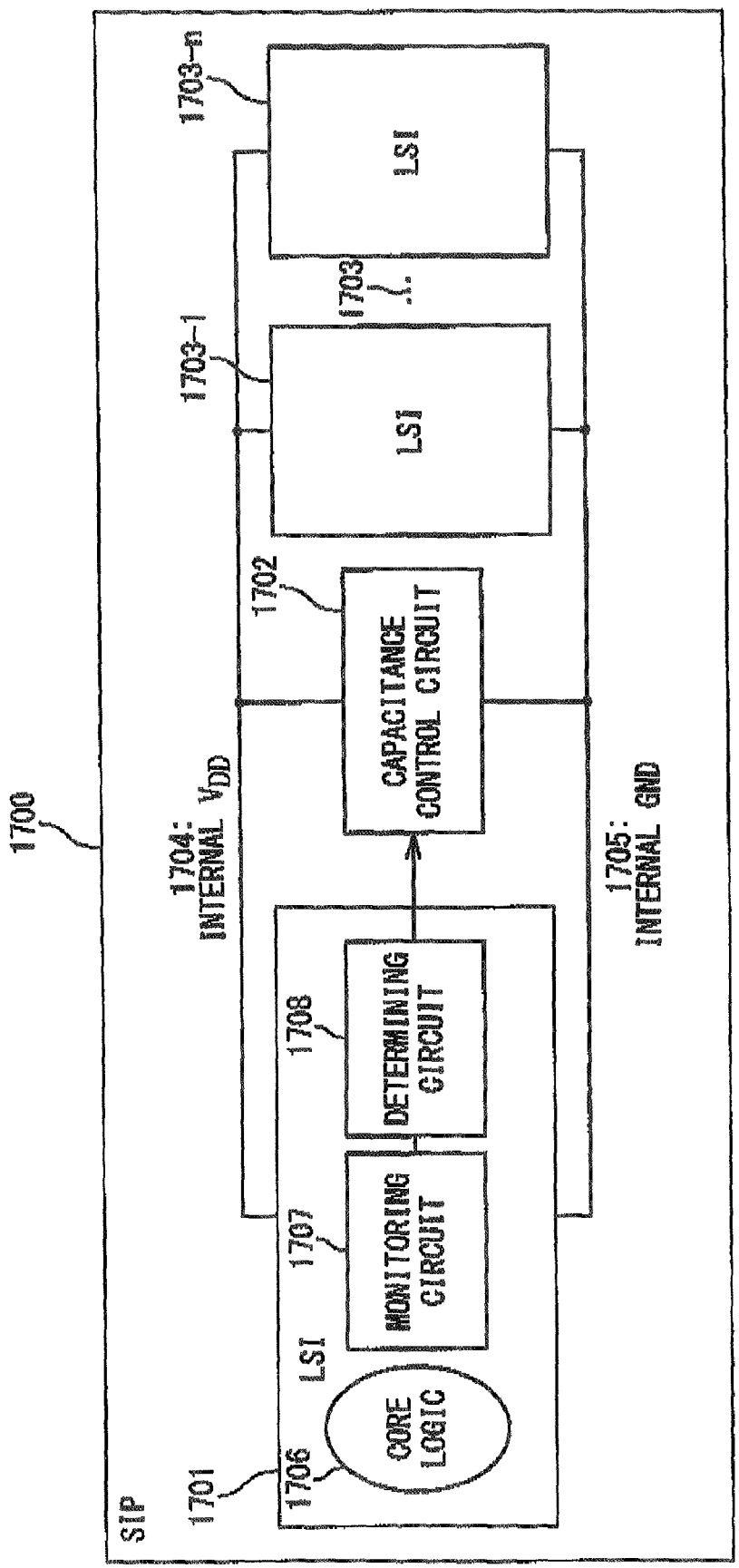
FIG. 17 is a block diagram showing a configuration of the semiconductor device according to a seventh embodiment of the present invention.

FIG. 17 shows an example which contains an LSI 1701, a capacitance control circuit 1702, and LSIs 1703 (1703-1, ..., 1703-n) connected between a system power supply line (VDD) and a system ground line (GND). The LSI 1707 is composed of a core logic section 1706, a monitoring circuit 1707 and a determining circuit 1708. The output of the monitoring circuit 1707 is supplied to the determining circuit 1708 and the output of the determining circuit 1708 is supplied to the capacitance control circuit 1702. It should be noted that the core LOGIC section 1706, the monitoring circuit 1707, the determining circuit 1708 may be same as those shown in FIG. 1. The LSIs 1703 (1703-i, i=1 to n: n is the number of the LSIs) means at least one LSI. Also, the LSI 1703 may have the same circuit configuration as the LSI 1701.

Figure 18:
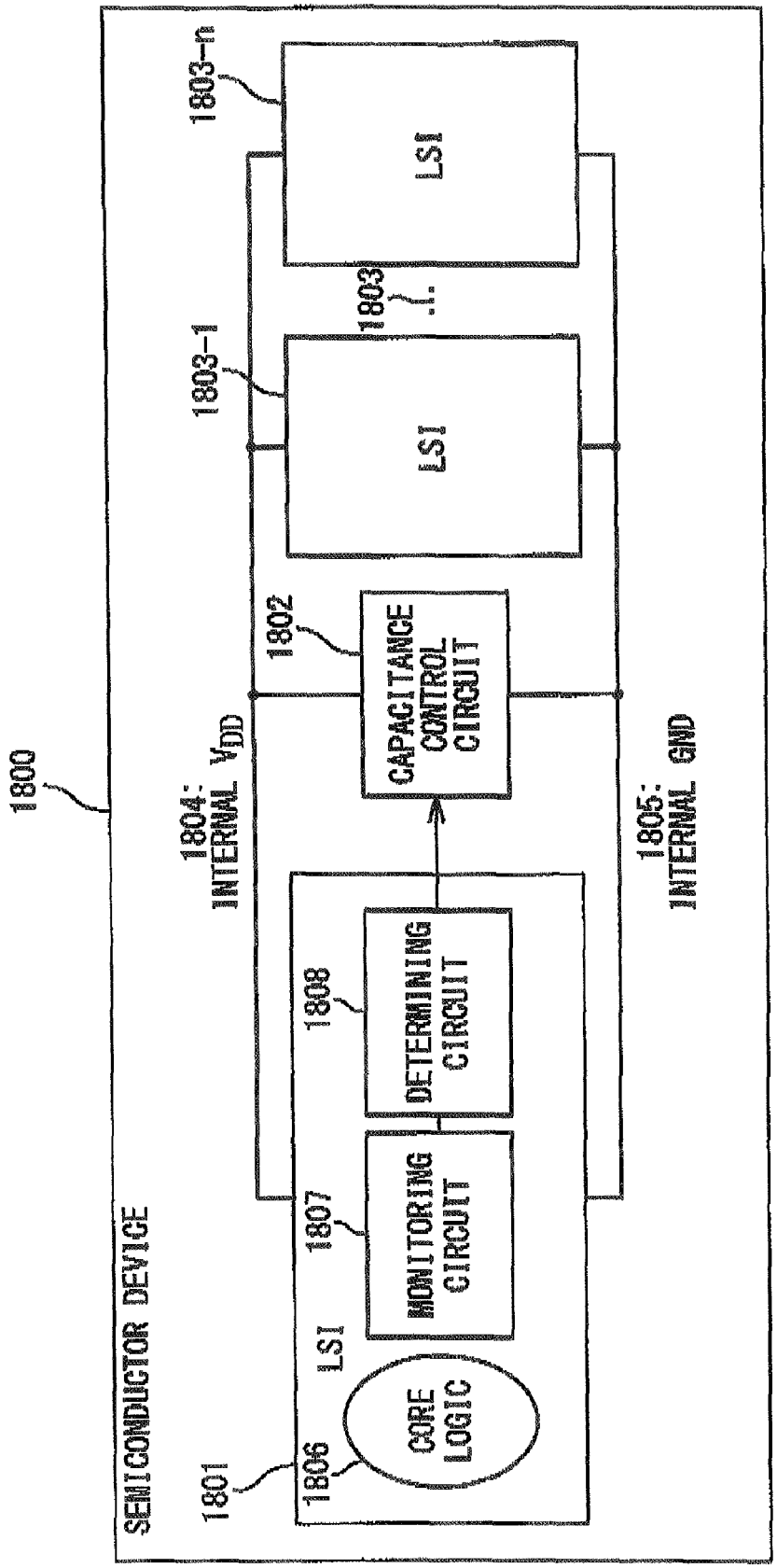
FIG. 18 is a block diagram showing a configuration of the semiconductor device according to an eighth embodiment of the present invention.

FIG. 18 is an example in which a monitoring circuit, and a determining circuit are mounted in an LSI and a capacitance control circuit is mounted on a printed circuit board. The apparatus 1800 is composed of a LSI 1801, a capacitance control circuit 1802 and at least one LSI 1803. The LSI 1801, the capacitance control circuit 1802 and the LSI 1803 are provided between a system power supply line VDD 1804 and a system ground line GND 1805 in parallel. The LSI 1801 is composed of a core LOGIC section 1806, a monitoring circuit 1807 and a determining circuit 1808. The output of the monitoring circuit 1807 is supplied to the determining circuit 1808 and the output of the determining circuit 1808 is supplied to the capacitance control circuit 1802. It should be noted that the core LOGIC section 1806, the monitoring circuit 1807, the determining circuit 1808 may be same as those shown in FIG. 1. Also, the LSI 1803 may have the same circuit configuration as the LSI 1801.

Figure 19:
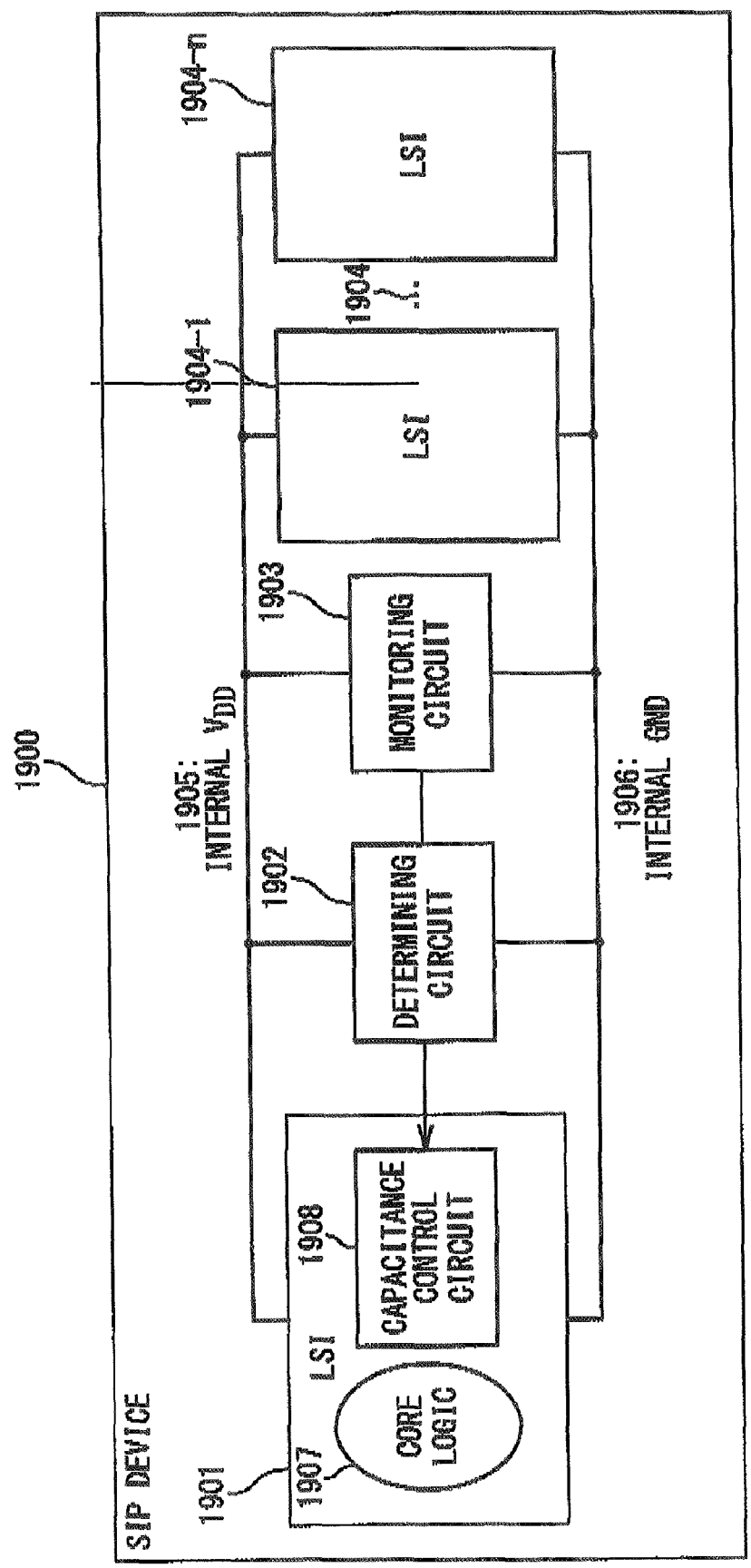
FIG. 19 is a block diagram showing a configuration of the semiconductor device according to a ninth embodiment of the present invention.

FIG. 19 is an example of a semiconductor package 1900 in which a capacitance control circuit 1908 is formed in an LSI 1901 and a monitoring circuit 1903 and a determining circuit 1902 are provided in the package 1900. The LSI 1901, the determining circuit 1902, the monitoring circuit 1903, and LSIs 1904 are provided between an internal power supply line VDD 1905 and an internal. ground line GND 1906 in parallel. The LSI 1901 is composed of a core LOGIC section 1907 and the capacitance control circuit 1908. The output of the monitoring circuit 1903 is supplied to the determining circuit 1902 and the output of the determining circuit 1902 is supplied to the capacitance control circuit 1908. It should be noted that the core LOGIC section 1907, the monitoring circuit 1903, the determining circuit 1902 and the capacitance control circuit 1908 may be same as those shown in FIG. 1. The LSIs 1904 (1904-i, i=1 to n: n is the number of the LSIs) means at least one LSI. The LSI 1904 may have the same circuit configuration as the LSI 1901.

Figure 20:
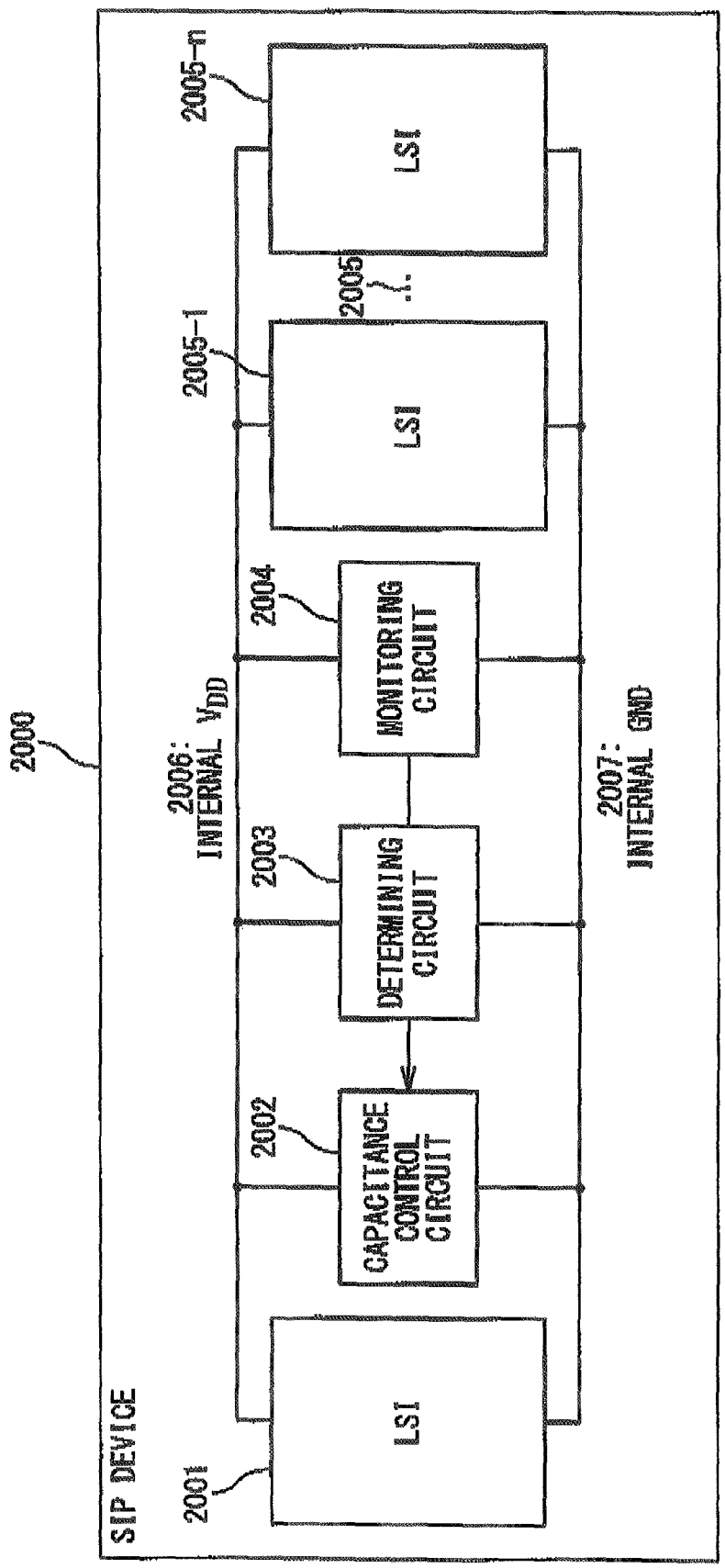
FIG. 20 is a block diagram showing a configuration of the semiconductor device according to a tenth embodiment of the present invention.

FIG. 20 is an example in which a monitoring circuit 2004, a determining circuit 2003, and a capacitance control circuit 2002 are provided in a semiconductor package 2000, in addition to an LSI 2001 and LSIs 2005. The LSI 2001, the capacitance control circuit 2002, the monitoring circuit 2004 and LSI 2005 are provided between the internal power supply VDD 2006 and internal ground line GND 2007 respectively in parallel. The output of the monitoring circuit 2004 is supplied to the determining circuit 2003 and the output of the determining circuit 2003 is supplied to the capacitance control circuit 2002. It should be noted that the monitoring circuit 2004, the determining circuit 2003 and the capacitance control circuit 2002 may be same as those shown in in FIG. 1. The LSIs 2005 (2005-i, i=1 to n: n is the number of LSIs) represent at least one LSI.

Figure 21:
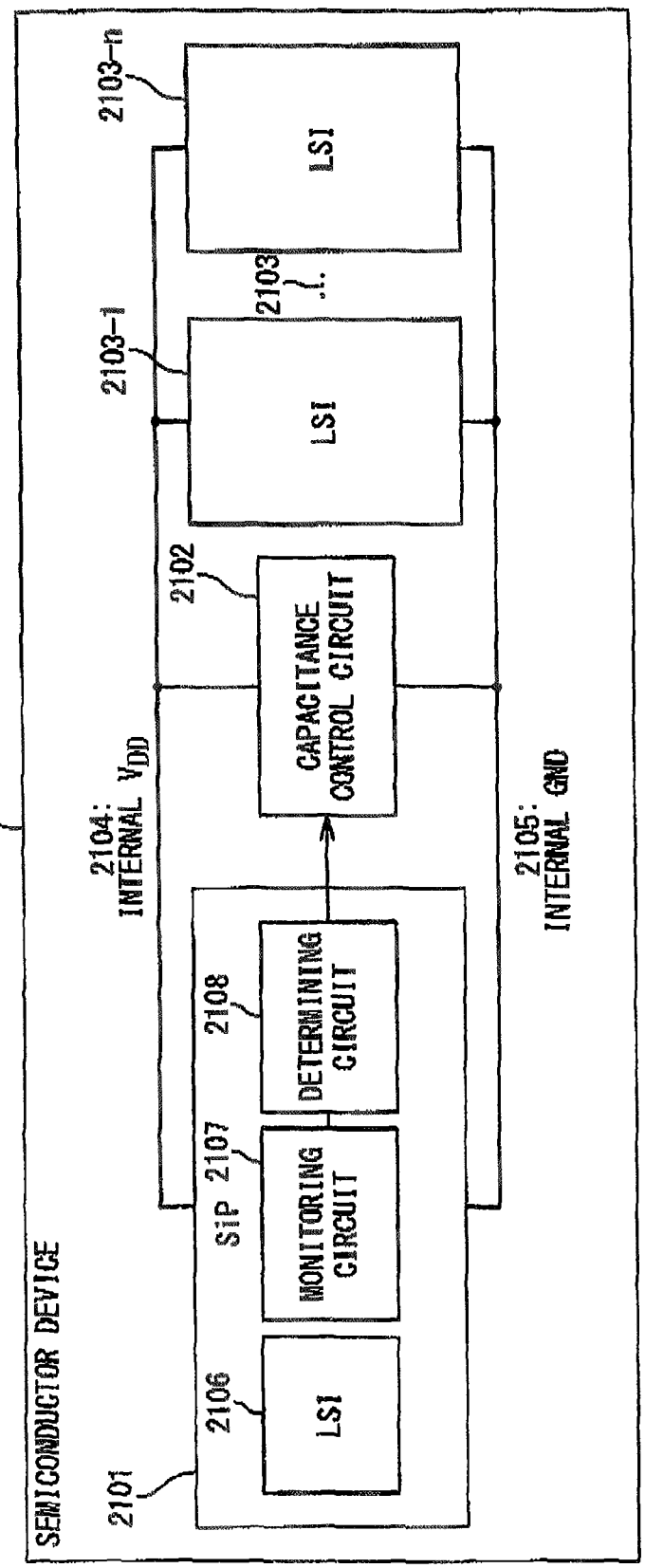
FIG. 21 is a block diagram showing a configuration of the semiconductor device according to an eleventh embodiment of the present invention.

FIG. 21 is an example in which a monitoring circuit 2107 and a determining circuit 2108 are provided in a semiconductor package (SiP) 2101, and a capacitance control circuit 2102 is provide on a substrate or printed circuit board of an apparatus 2100. LSIs 2103 are provided on the substrate of the apparatus 2100. The semiconductor package 2101, the capacitance control circuit 2102 and the LSIs 2103 are provided between a power supply line VDD 2104 and a ground line GND 2105 in parallel. The semiconductor package 2101 is composed of a core LOGIC part 2106, the monitoring circuit 2107 and the determining circuit 2108. The output of the monitoring circuit 2107 is supplied to the determining circuit 2108 and the output of the determining circuit 2108 is supplied to the capacitance control circuit 2102. It should be noted that the core LOGIC part 2106, the monitoring circuit 2107, the determining circuit 2108 and the capacitance control circuit 2102 may be same as those shown in FIG. 1. The LSIs 2103 (2103-i, i=1 to n: n is the number of LSIs) means at least one LSI.

Figure 22:
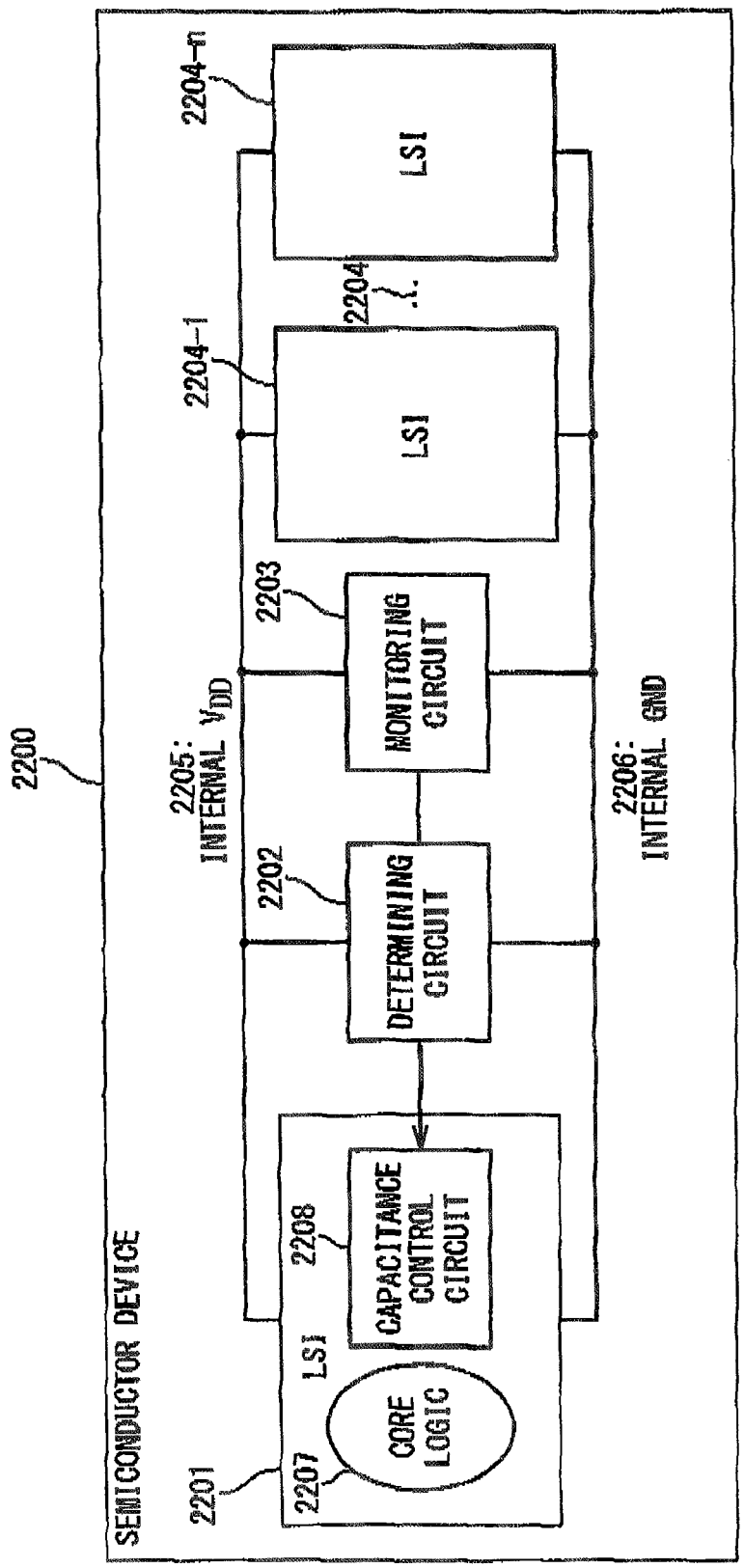
FIG. 22 is a block diagram showing a configuration of the semiconductor device according to a twelfth embodiment of the present invention.

FIG. 22 is an example in which a capacitance control circuit is provided in an LSI and a monitoring circuit and a determining circuit are provided on a substrate or printed circuit board of an apparatus. A LSI 2201, a determining circuit 2202, a monitoring circuit 2203 and LSIs 2204 are provided on the apparatus substrate 2200. The LSI 2201, the determining circuit 2202, the monitoring circuit 2203 and the LSI 2204 are provided between a power supply line VDD 2205 and a ground line GND 2206 in parallel. The LSI 2201 is composed of a core LOGIC part 2207 and a capacitance control circuit 2208. The output of monitoring circuit 2203 is supplied to the determining circuit 2202 and the output of the determining circuit 2202 is supplied to the capacitance control circuit 2208. It should be noted that the core LOGIC part 2207, the monitoring circuit 2203, the determining circuit 2202 and the capacitance control circuit 2208 may be same as those shown in FIG. 1. The LSIs 2204 (2204-i, i=1 to n: n is the number of the LSIs) represent at least one LSI. Also, the LSI 2204 may have the same circuit configuration as the LSI 2201.

Figure 23:
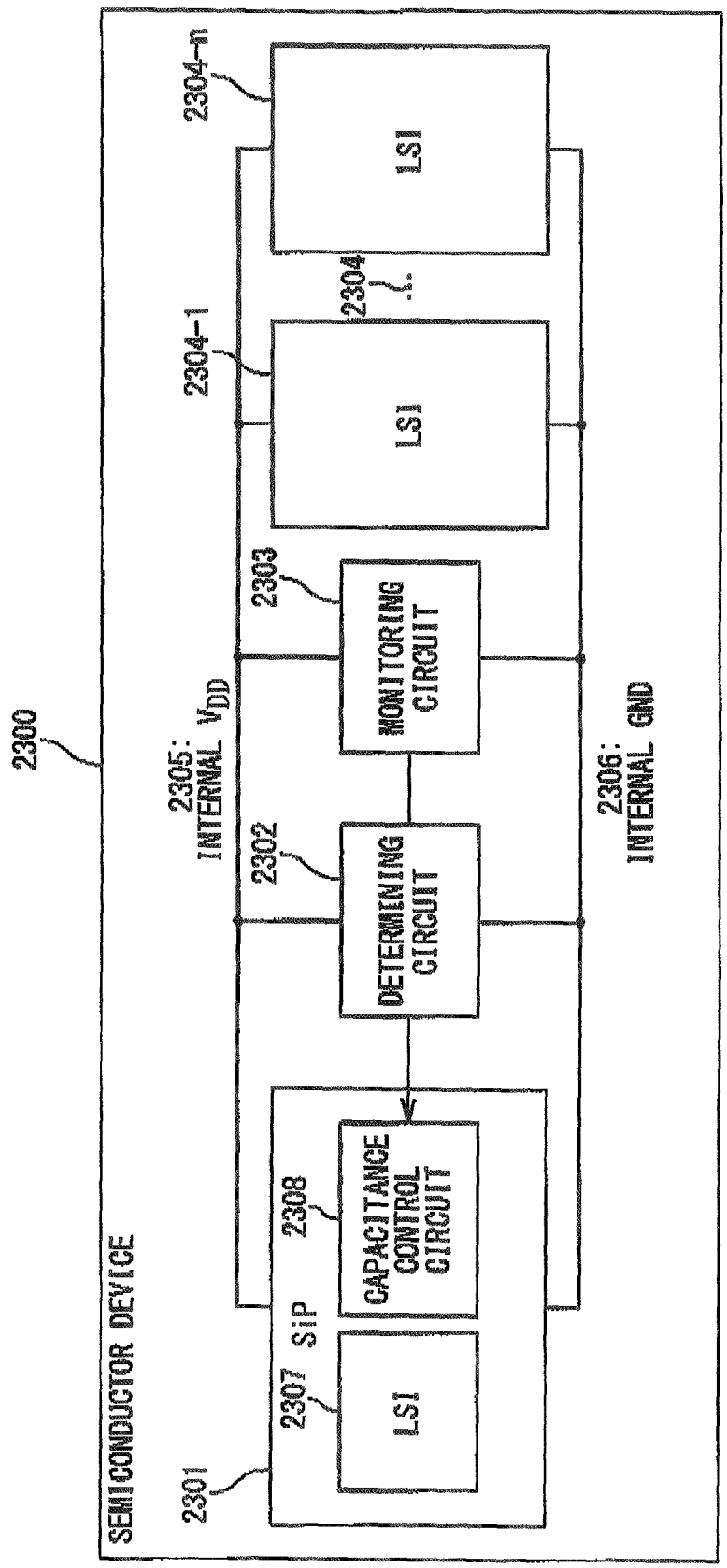
FIG. 23 is a block diagram showing a configuration of the semiconductor device according to a thirteenth embodiment of the present invention.

FIG. 23 is an example in which a capacitance control circuit is provided in a semiconductor package (SiP) and a monitoring circuit and a determining circuit are provided on a substrate or printed circuit board 2300 of an apparatus. A SiP 2301, a determining circuit 2302, a monitoring circuit 2303 and LSIs 2304 are provided on the apparatus substrate 2300 between a power supply line VDD 2305 and a ground line GND 2306 in parallel. The SiP 2301 is composed of an LSI 2307 and a capacitance control circuit 2308. The output of the monitoring circuit 2303 is supplied to the determining circuit 2302 and the output of the determining circuit 2302 is supplied to the capacitance control circuit 2308. It should be noted that the monitoring circuit 2303, the determining circuit 2302 and the capacitance control circuit 2308 may be same as those shown in FIG. 1. The LSIs 2304 (2304-i, i=1 to n: n is the number of the LSIs) represent at least one LSI.

Figure 24:
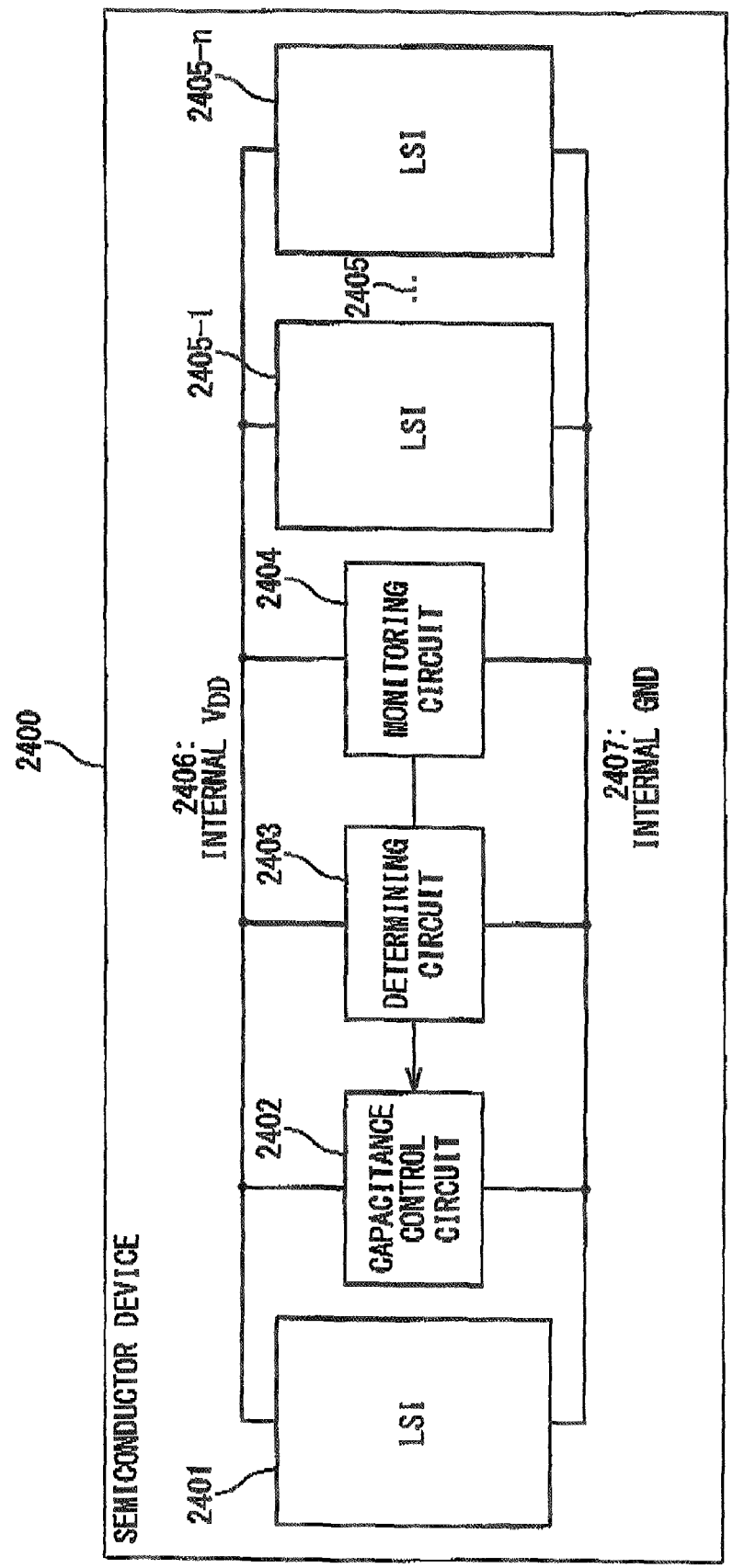
FIG. 24 is a block diagram showing a configuration of the semiconductor device according to a fourteenth embodiment of the present invention.

FIG. 24 is an example in which a monitoring circuit, a determining circuit, and a capacitance control circuit provided on a substrate or printed circuit board 2400 of an apparatus. An LSI 2401, a capacitance control circuit 2402, a determining circuit 2403, a monitoring circuit 2404 and LSIs 2405 are provided on the substrate 2400. The LSI 2401, the capacitance control circuit 2402, the monitoring circuit 2404 and the LSIs 2405 are provided between a power supply line VDD 2406 and a ground line GND 2407 in parallel. The output of the monitoring circuit 2404 is supplied to the determining circuit 2403 and the output of the determining circuit 2403 is supplied to the capacitance control circuit 2402. It should be noted that the monitoring circuit 2404, the determining circuit 2403 and the capacitance control circuit 2402 may be same as those shown in FIG. 1. The LSIs 2405 (2405-i, i=1 to n: n is the number of the LSIs) represent at least one LSI.

Figure 25:
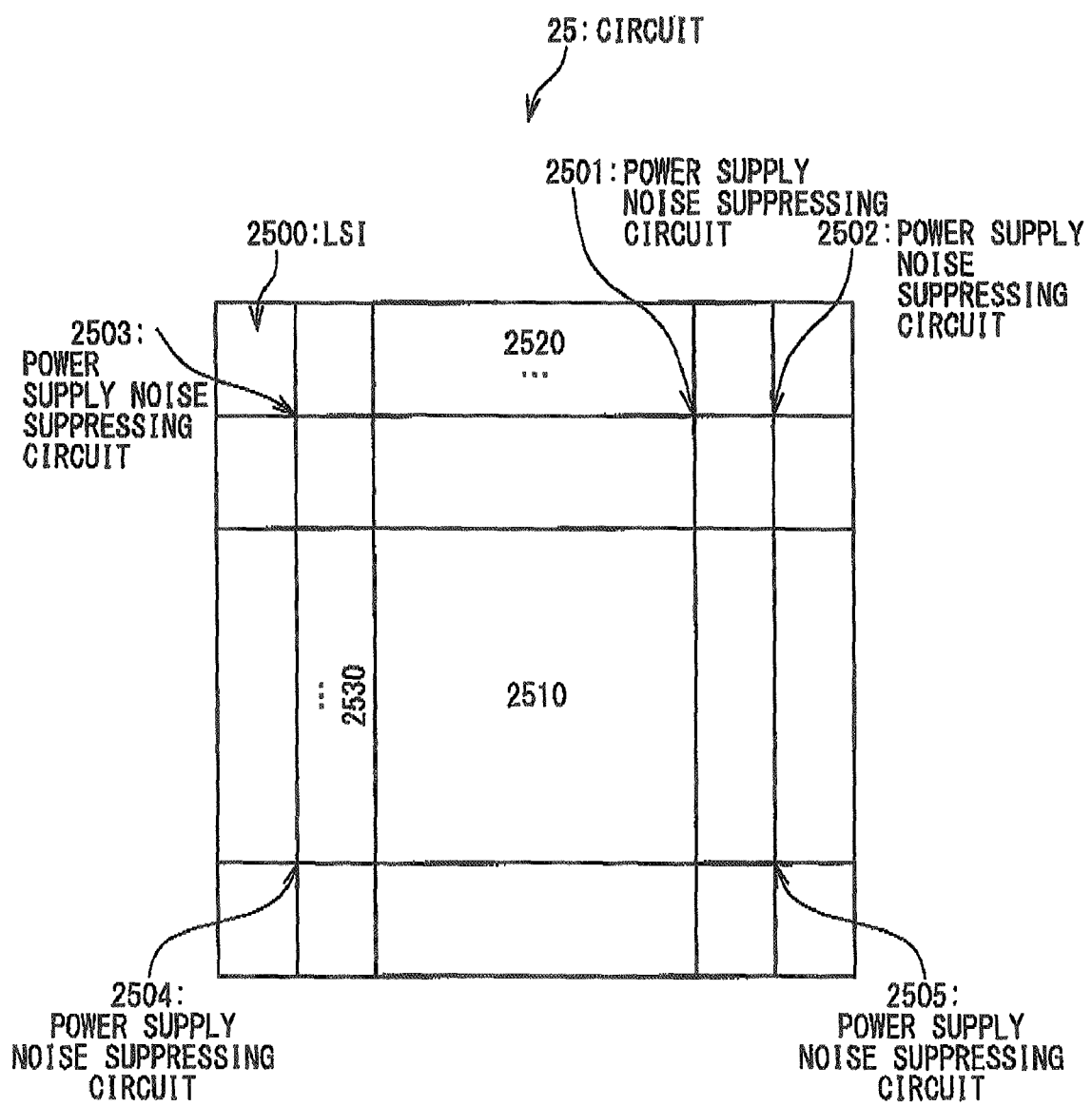
FIG. 25 is a diagram showing an arrangement of the noise suppressing circuit in the semiconductor device of the present invention.

Next, an example in which a plurality of noise suppressing circuits are arranged, will be described as a seventh embodiment below. A circuit 25 shown in FIG. 25 is an example in which an LSI area is divided into a plurality of areas and a noise suppressing circuit is arranged in each area. The LSI 2500 contained in the circuit 25 is composed of power supply noise suppressing circuits 2501 to 2505. Also, the LSI 2500 is divided into a plurality of areas. Here, the areas 2510, 2520, and 2530 are shown.

Figure 26:
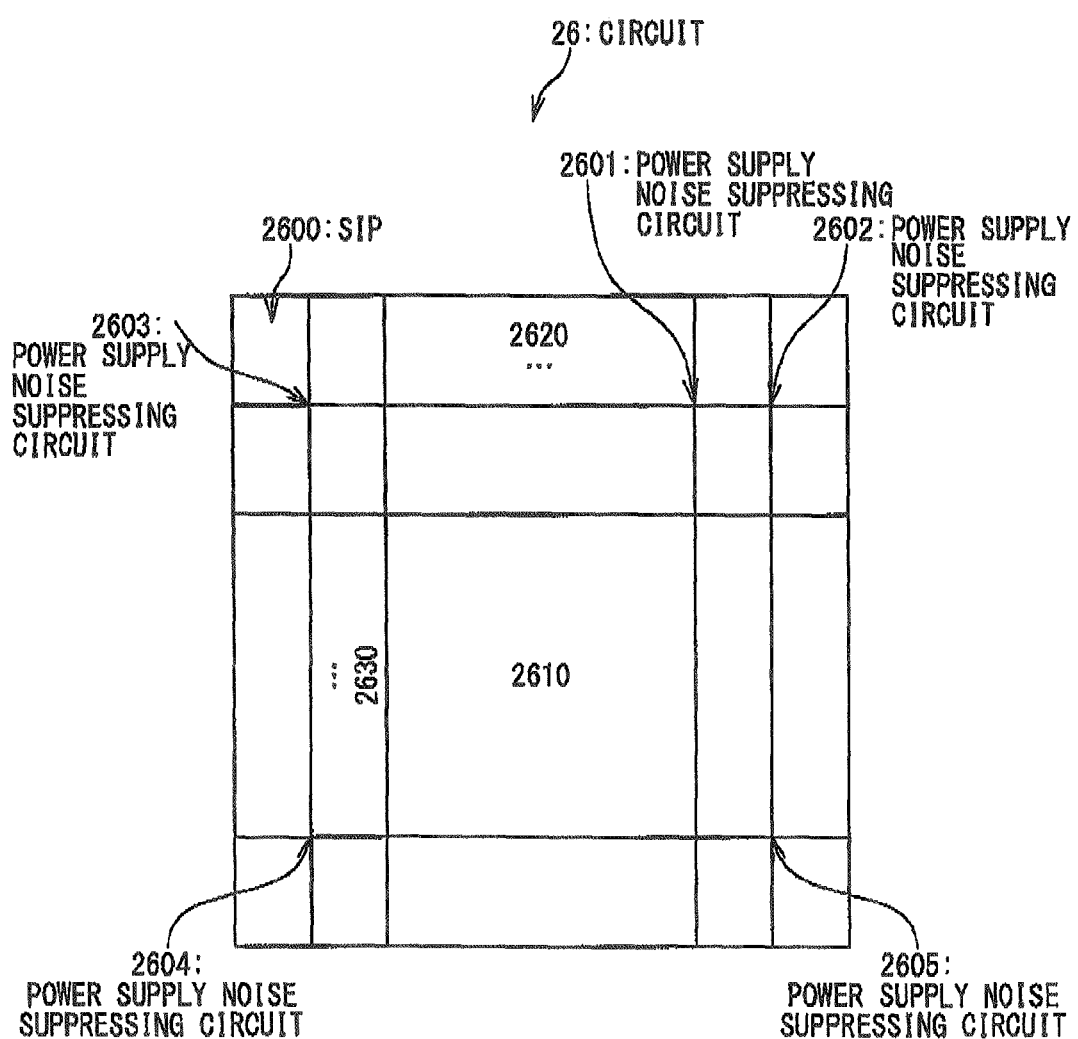
FIG. 26 is a diagram showing another arrangement of the noise suppressing circuit in the semiconductor device of the present invention.

The circuit 26 shown in FIG. 26 is an example in which an SiP area is divided into a plurality of areas, and a noise suppressing circuit is arranged in each area. An LSI contained in the circuit 26 is composed of power supply noise suppressing circuits 2601 to 2605. Also, the SiP area is divided into a plurality of areas. Here, the areas 2610, 2620, and 2630 are shown.

Figure 27:
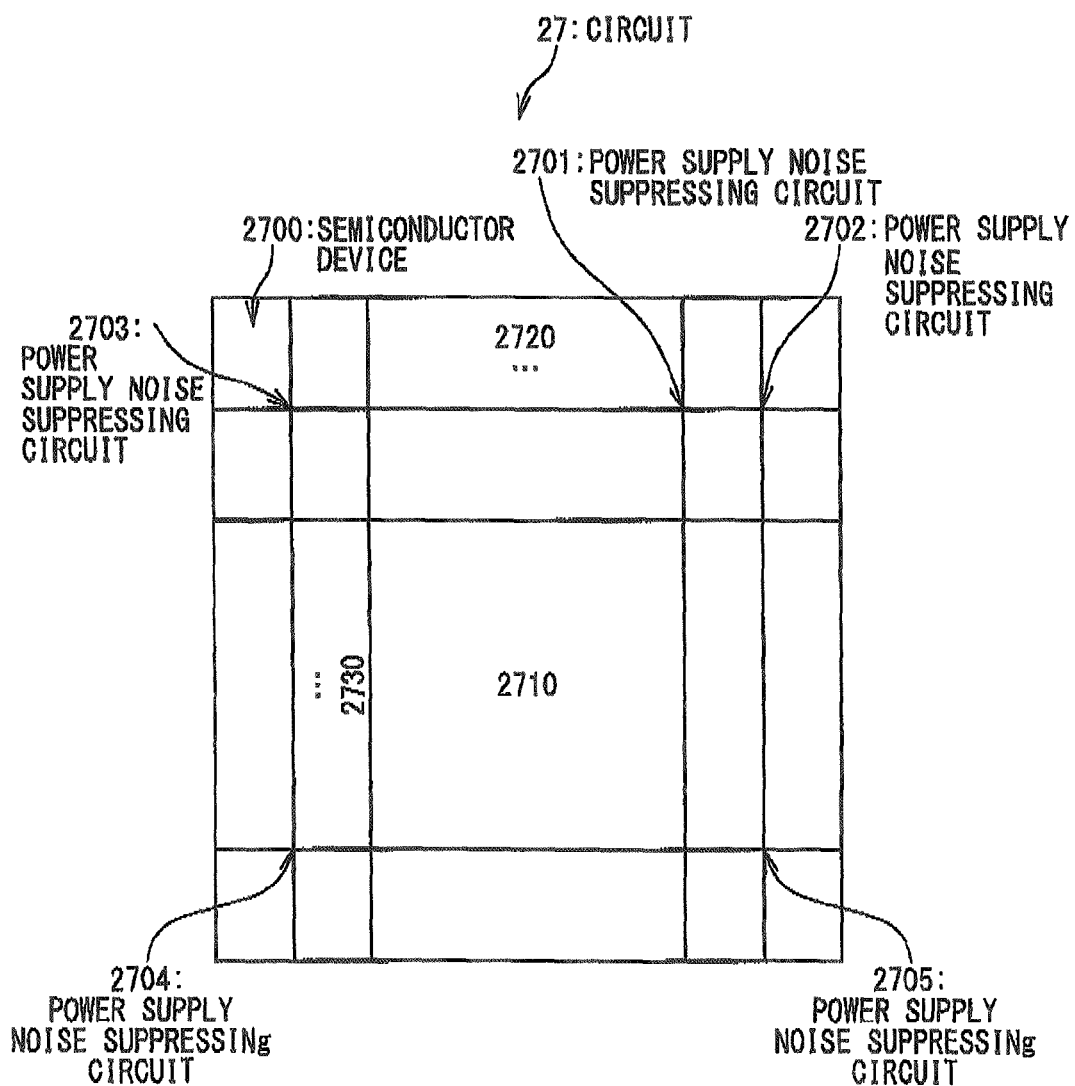
FIG. 27 is a diagram showing another arrangement of the noise suppressing circuit in the semiconductor device of the present invention.

A circuit 27 shown in FIG. 27 is an example in which a board area is divided into a plurality of areas and a noise suppressing circuit is arranged in each area. The power supply noise suppressing circuits 2701 to 2705 are provided on the substrate contained in circuit 27. Also, an LSI area is divided into a plurality of areas. Here, the areas 2710, 2720, and 2730 are shown.

Figure 28:
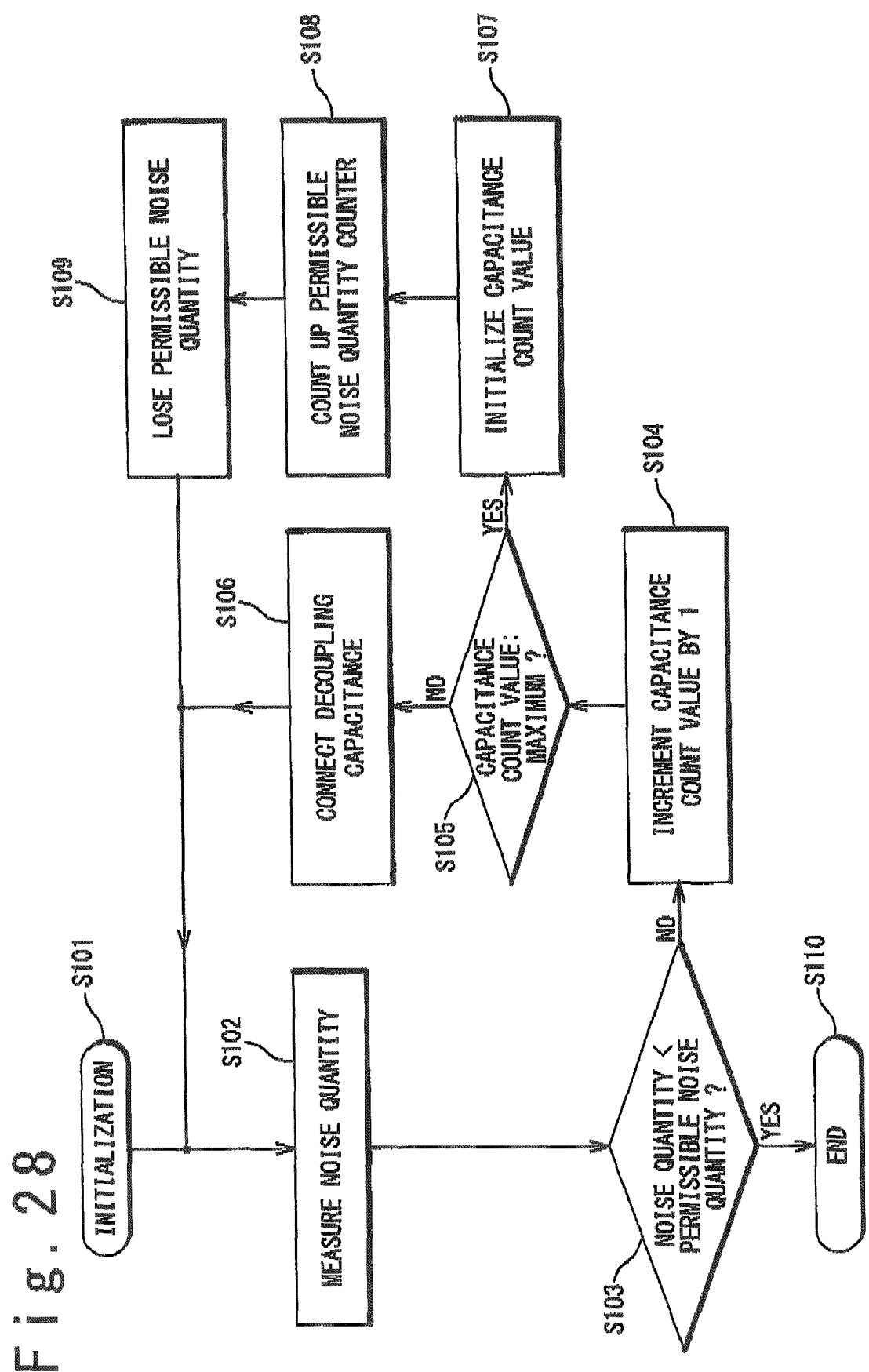
FIG. 28 is a flow chart showing an operation of the semiconductor device according to the present invention.

Next, an operation of the noise suppressing circuit in the first embodiment shown in FIG. 11 will be described. A voltage level monitor circuit 1101, a permissible noise quantity determining circuit 1102, and a capacitance control circuit A 1103 of the noise suppressing circuit of FIG. 11 correspond to the circuits 102, 103, and 104 of FIG. 1, and correspond to circuits 200, 600, and 800, respectively. FIG. 28 is a flow chart showing the operation.

Step S101:

As an initialization operation, a reference voltage 203 is set to the voltage level monitoring circuit 1101. The count value of the permissible noise counter is set to "0", and the count value of the capacitance counter in the capacitance control circuit A 1103 is set to "0". The switches for the decoupling capacitances are all turned off to set the capacitances to an OPEN state.

(2) Step S102

In the voltage level monitoring circuit 1101, the comparator 601 determines a difference between an internal voltage 202 and a reference voltage 203 and an A/D converter (not shown) converts the difference into a digital noise quantity 1106.

(3) Step S103

In the permissible noise quantity determining circuit 1102, it is determined by the comparator 601 whether or not the noise quantity 1106 is within a permissible noise quantity 604. At this time, a permissible noise quantity 604 (which may be "0") is previously set to the comparator 601. In this way, the comparator 601 compares the noise quantity 1106 (603) with the permissible noise quantity 604 and outputs a capacitance control signal 1107 (605) indicating the comparison result to the capacitance control circuit A 1103. At this time, as capacitance control signal 1107 (605) is in a H level, when the noise quantity 1106 (603) is larger than the permissible noise quantity from the counter 602, and is in an L level, otherwise.

(4) Step S104

In the capacitance control circuit A 1103 (800), the capacitance counter 801 receives the capacitance control signal 605 (804). The capacitance counter 801 contains a sampling clock generating circuit (not shown). The capacitance control signal 605 (804) continues to be sampled in response to a sampling clock signal generated by the sampling clock generating circuit. When the noise quantity 1106 (603) is larger than the permissible noise quantity 604 so that the signal of the H level is outputted, the capacitance counter 801 is counted up, for example, by one based on the sampling result. It should be noted that the frequency (or period) of the sampling clock is preferably determined to have a time sufficient to determine a value of a new capacitance control signal 605 (804) after the following steps.

(5) Step S105

The upper limit of the count value of the capacitance counter 801 is equal to (1+the number of switches in the capacitance array circuit 803). When the count value is increased to the upper limit, a step S107 is performed.

(6) Step S106

The capacitance counter 801 always outputs the count value to the switch control circuit 802 as the capacitance count signal 806. The switch control circuit 802 decodes the capacitance count signal 806 and outputs the switch control signal 807 to turn on the switches in the capacitance array 802 for the number which is equal to the capacitance count value. The switches of the capacitance array circuit 803 are turned on in response to the switch control signal 807 to connect capacitors between the internal VDD 1000 and internal GND 1001.

(7) Step S107

When the capacitance counter 801 counts the upper limit, the capacitance counter 801 is reset and outputs an overflow signal (not shown) of a pulse-shape to the a permissible noise counter 602.

(8) Step S108

The permissible noise quantity counter 602 performs a count operation of the overflow signal so that the held count value is incremented.

(9) Step S109

A loose permissible noise quantity 604 is outputted to the comparator 601 according to the count value of the permissible noise quantity counter 602. Then, the above process is repeated.

(10) Step S110

When this system becomes stable as the capacitance counter 801 counts up, that is, when the noise quantity 1106 (603) becomes equal to or less than the permissible noise quantity 604 as the output value of the permissible noise counter 602 (step S103-Yes), the capacitance counter 801 stops the counting operation because the capacitance control signal 605 is in the L level. At the same time, the capacitance counter 801 outputs a capacitance control end signal 805 to the permissible noise counter 602 to stop the change of the permissible noise quantity. In this way, the noise monitoring/measuring operation, the noise determining operation, and the capacitance control operation are stopped.

Also, referring to FIG. 28, the operation of the noise suppressing circuit in the second embodiment shown in FIG. 12 will be described. A clock jitter monitoring circuit 1201, a permissible noise quantity determining circuit 1202, and a capacitance control circuit A 1203 of the noise suppressing circuit of FIG. 12 correspond to the circuits 102, 103, and 104 of FIG. 1, and correspond to circuits 400, 600, and 800, respectively. An initialization operation and a clock signal jitter monitor will be described. The description of the other operations is omitted because the operations other than the initialization operation and the clock signal jitter monitor are same as those of the noise suppressing circuit in the first embodiment shown in FIG. 11.

At the step S101 of FIG. 28, the number of reference clocks is set to the clock jitter monitoring circuit 1201 in the initialization operation. Then, the number of ideal clocks is supplied. The count value of the permissible noise counter is reset to "0". The count value of the capacitance counter in the capacitance control circuit A 1203 is reset to "0", and the switches of the decoupling capacitors are all turned off to set the capacitors to an OPEN state. Here, the internal signal 1204 and the reference value 1205 correspond to the internal clock signal 404 and the reference clock signal 405. The ideal internal clock count 407 in FIG. 4 is previously set to the clock jitter monitoring circuit (this may be set externally).

At the step S102 of FIG. 28, the clock jitter monitoring circuit 1201 quantifies the noise superimposed on the internal clock signal as the jitter quantity. More specifically, in the clock jitter monitoring circuit 400, the counter 402 counts the number of pulses of the reference clock signal 405 which passes through the AND gate 401 during a period corresponding to a pulse width of the internal clock signal 404 (a period of the internal clock signal in the H level). The calculating circuit 403 calculates a difference of the count value (the digital value) 406 of the internal clock signal and the ideal internal clock count value 407 and outputs the result as a jitter quantity 408. In this way, the jitter quantity 408 is the noise quantity 1206 just as it is. When a negative value is to be considered, a predetermined positive value may be added to the difference. It should be noted that the counter 402 contains a register (not shown), and the count value is latched by the register at the falling edge of the internal clock signal 404, and the output of the register is the internal clock signal count value 406. Also, after the latching operation by the register is complete, the count value of the counter 402 is reset.

Figure 29A:
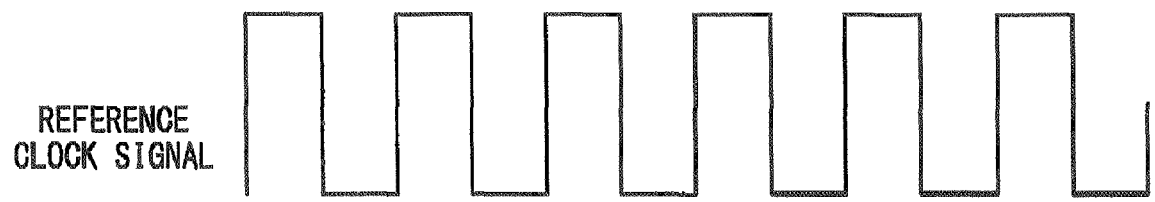
FIGS. 29A to 29C are timing charts showing waveform of a reference clock, internal clock and a input to counter in the present invention.
Figure 29B:
Figure 29C:
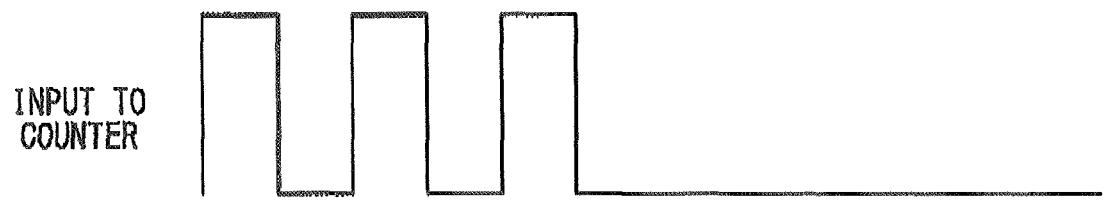

FIGS. 29A to 29C show an example of the count operation. FIG. 29A shows a reference clock signal, FIG. 29B shows an internal clock signal, and FIG. 29C shows an input to the counter.

Moreover, the above count value and the number 407 of counts of the ideal internal clock signal are supplied to the calculating circuit 403 to calculate a difference, and to output the calculation result as the noise quantity 401.

Because the pulse duration of the internal clock signal (the period of the internal clock signal in the H level) changes to the ideal clock when undergoing influence by the power supply noise, the count value 406 of the internal clock signal 404 differs from the count value 407 of the ideal internal clock signal, and the difference is observed as the jitter. In other words, the jitter of the internal clock signal 404 can be monitored and detected as the change of the pulse duration. That is, the clock jitter monitoring circuit 400 detects a pulse width of the internal clock signal and outputs a change of the pulse width as the noise quantity.

Also, the operation of the clock jitter monitoring circuit in another embodiment will be described. As shown in FIG. 5, the internal clock signal 500 is divided by the frequency divider 503. Thus, the internal clock signal 500 can be counted if it is too high-rate to count it with the reference clock signal 507.

Figure 30:
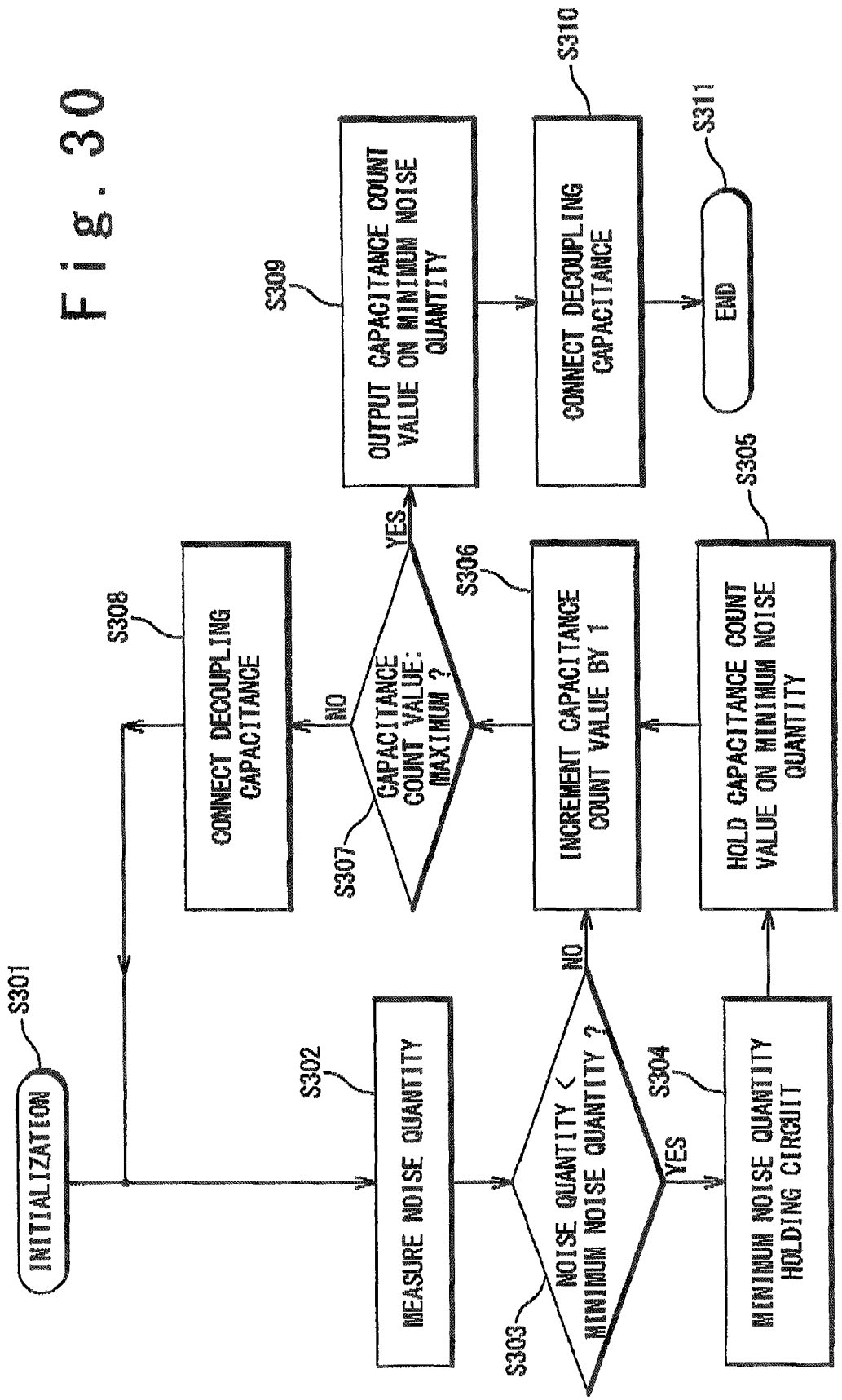
FIG. 30 is a flow chart showing another operation of the semiconductor device according to the present invention.

Next, the operation of the noise suppressing circuit of the third embodiment shown in FIG. 13 will be described. FIG. 30 shows a flow of the operation.

(1) Step S301

AS an initialization operation, the reference voltage 1305 is set to the voltage level monitoring circuit 1301 (200). The count value of the permissible noise counter 602 is reset to "0", and the count value of the capacitance counter 901 in the capacitance control circuit B 1303 is set to "0". The switches of the decoupling capacitances are all turned off to set the capacitances to an OPEN state.

(2) Step S302

The voltage level monitoring circuit 1301 detects the noise quantity. Here, the voltage level monitoring circuit 1301 is composed of the voltage level monitoring circuit 200 and the A/D converter (not shown). Therefore, the voltage level monitor circuit 1301 outputs a digital value obtained through A/D conversion of the voltage difference 204 as the noise quantity 1306. The details are same as above-mentioned circuit and the description is omitted.

(3) Step S303

In the noise quantity comparing and determining circuit 1302 (700), the comparator 701 compares the minimum noise quantity 704 (for example, a maximum value of a digital value has been set) from the minimum noise quantity holding circuit and the noise quantity 1306 (703) obtained as mentioned above. A signal indicating the comparison result is the capacitance control signal 705 (904).

(4) Step S304

The minimum noise detection signal 706 is outputted when the noise quantity 703 smaller than the minimum noise quantity 704 which has been stored in the minimum noise holding circuit 702 is detected. For example, the minimum noise detection signal 706 is in H level when the noise quantity 1306 (703) is smaller than the minimum noise quantity 704, and is in the L level, otherwise. The minimum noise detection signal 706 is connected with the capacitance counter 901 and the minimum noise quantity holding circuit 702 (not shown). When the minimum noise detection signal is in the H level, the minimum noise holding circuit 702 holds the noise quantity 1306 (703) at that time, and outputs it to the minimum noise quantity 704.

(5) Step S305

When the minimum noise detection signal 706 from the comparator 701 becomes H level, the capacitance counter 901 holds a counter value at this time (the minimum noise quantity) in a different register (not shown) to have inside.

(6) Step S306

In the capacitance control circuit B 1303 (900), the capacitance counter 901 receives the minimum noise detection signal 1308 (905) and the capacitance control signal 1307 (904). For example, the capacitance counter 901 contains an internal clock generating circuit (not shown) and counts the internal clock signal generated by the internal clock generating circuit. It should be noted that the operation frequency of the internal clock signal has a frequency sufficient for the event that the capacitance increases after capacitance counter 901 counts up and then the capacitance control signal 904 corresponding to the noise quantity 703 at that time is supplied to the capacitance counter 901 again.

(7) Step S307

The capacitance counter 901 determines whether or not the count value of the counter 901 reaches the upper limit of the count value. The upper limit of the count value of the capacitance counter 901 is equal to (1+the number of switches in the capacitance array circuit 903).

(8) Step S308

The count value of the capacitance counter 901 is always sent to the switch control circuit 902 which turns on the decoupling capacitances of capacitance array circuit 903 based on the count value. In this way, as the capacitance counter 901 counts up, the decoupling capacitances are turned on to increase a capacity value to the upper limit of the counter.

(9) Step S309

When the count value of the capacitance counter 901 reaches the upper limit (step S307-Yes), the counter value is changed into a value held by the register. In other words, the count value of the capacitance counter 901 is scanned to search the count value at the minimum noise quantity and the count value 906 at the minimum noise quantity is set in the capacitance counter 901 again. The capacitance counter 901 outputs the count value at the minimum noise quantity to the switch control circuit 902 as the capacitance count signal 906. The switch control circuit 902 outputs the switch control signal 907 to the capacitance array circuit 903.

(10) Step S310

The capacitance array circuit 903 sets the decoupling capacitances based on the switch control signal 907.

(11) Step S311

The control of the noise suppressing circuit ends and the noise measuring operation, the noise determining operation, and the capacitance control operation are stopped.

Next, the noise suppressing circuit in the fourth embodiment shown in FIG. 14 composed of the clock jitter monitoring circuit, the noise quantity comparing and determining circuit, and the capacitance control circuit will be described.

This circuit detects the noise of the clock signal system and can implement a noise restraint function for a constant time. The description of the operation of the individual circuit is omitted.

Next, a case that a timing control circuit is added to the noise suppressing circuit in the fifth embodiment shown in FIG. 15 to control the operation of the noise suppressing circuit will be described.

A control signal 1101 is supplied to the noise suppressing circuit from the timing control circuit 1501. The noise suppressing circuit carries out the noise measuring operation, the determining operation, and the capacitance control operation only when receiving this control signal 1101.

The timing control circuit 1501 outputs the control signal 1101 for a predetermined time when power is turned on or after a reset operation has been carried out.

The timing control circuit 1501 counts the internal clock signal for the timing control count value by using the timing control counter 1601. The timing control circuit 1501 outputs the control signal 1201 during the period of the courting operation. Also, the count value can be reset in response to a reset signal. Thus, the noise suppressing circuit can be controlled to operate at an optional timing.

Next, an operation of the noise suppressing circuit in the sixth embodiment shown in FIGS. 17 to 24 when the arrangement of the noise measuring section and the capacitance array are separated will be described. Here, examples of the combination of the arrangement in the LSI, the SiP, and the substrate will be described below with reference to FIGS. 1, and 17 to 24.

In FIG. 1, noise is measured in the LSI and the noise is restrained by automatically controlling the decoupling capacitance in the LSI.

In FIG. 17, the noise is measured at the LSI in the SiP and the noise is restrained by automatically controlling the decoupling capacitance in the SiP.

In FIG. 18, the noise is measured in the LSI on the substrate and the noise is restrained by automatically controlling the decoupling capacitance on the substrate.

In FIG. 19, the noise is measured by the LSI in the SiP and the noise is restrained by automatically controlling the decoupling capacitance on the SiP.

In FIG. 20, the noise is measured by the SiP and the noise is restrained by automatically controlling the decoupling capacitance on SiP.

In FIG. 21, the noise is measured by the SiP and the noise is restrained by automatically controlling the decoupling capacitance on the substrate.

In FIG. 22, the noise is measured on the substrate and the noise is restrained by automatically controlling the decoupling capacitance of the LSI on the substrate.

In FIG. 23, the noise is measured on the substrate and the noise is restrained by automatically controlling the decoupling capacitance on the SiP.

In FIG. 24, the noise is measured on the substrate and the noise is restrained by automatically controlling the decoupling capacitance.

Next, the operation when a plurality of noise suppressing circuits are arranged, as shown in FIGS. 25 to 27 in the seventh embodiment will be described.

Even if the noise suppressing circuits are arranged individually in areas, the noise suppressing circuits operate independently from each other. Therefore, the capacitance is optimized for every area to suppress the noise over the whole apparatus.

In FIG. 25, the noise suppressing circuit operates in each of areas obtained by dividing the whole area of an LSI into the plural independent areas.

In FIG. 26, the noise suppressing circuit operates in each of areas by dividing the whole area of an SiP into the plural independent areas.

In FIG. 27, the noise suppressing circuit operates in each of areas by dividing the whole area of a substrate into the plural independent areas.

In this way, in the noise suppressing circuit of the semiconductor circuit of the present invention, the monitoring circuit monitors, detect and digitalizes quantities of various noises such as power supply noise, signal jitter noise, and electromagnetic wave radiation noise depending on the use environment of the circuit, the determining circuit detects an optimal capacitance, and the capacitance control circuit dynamically controls the capacitance of the decoupling capacitor. Thus, the noise can be restrained.

In the first embodiment, the power supply voltage level monitoring circuit monitors and detects the power supply noise directly. The permissible noise quantity determining circuit determines the capacitance such that the detected noise quantity falls within the permissible noise quantity. Because all combinations of capacitances are tried in order to detect the capacitance which becomes minimum noise when a noise quantity comparing and determining circuit is used, there is a possibility that the capacitance value becomes improper for the trial so that the noise increases oppositely.

In the second embodiment, the clock signal monitoring circuit monitors and detects the influence of the noise on the clock signal system. When the influence on the clock signal should be cared, this is effective. Also, this embodiment has an advantage of the above-mentioned permissible noise quantity determining circuit.

In the third embodiment, the power supply voltage level monitoring circuit monitors and detects the power supply noise directly. The noise quantity comparing and determining circuit can detect the minimum capacitance value for a predetermined time because it is possible to determine the minimum capacitance value if all combinations of the capacitances are carried out. In case of the permissible noise quantity determining circuit, when the detected noise quantity does not fall within a range of permissible noise quantity, the permissible noise quantity is increased and the measurement is repeated. Therefore, depending on the degrees of the increase, the permissible noise quantity is met but there is a case that the determined capacitance is not optimal. Also, for the repeat of the condition, a setup time of the optimal capacitance can be sometimes prolonged.

The fourth embodiment has the features of the above-mentioned clock signal monitoring circuit and the noise quantity comparing and determining circuit.

In the fifth embodiment, the timing control circuit control the operation of the noise suppressing circuit. Thus, the noise suppressing circuit can be operated only for the necessary period. For example, it is possible to perform the noise restraint operation again for a predetermined time after the power is turned on or a reset is instructed.

In the sixth embodiment, because the noise suppressing circuit is separated into a measuring section, determining section and a capacitance array which are arranged in the LSIs, the SiP, and the substrates. The noise suppressing effect can be expected even if the measuring circuit and a noise generating source are distant.

In the seventh embodiment, the whole area of the LSI, the SiP, or the substrate is divided into a plurality of areas, and the noise suppressing circuit is arranged in each of the areas. Therefore, the capacitance of the decoupling capacitor in each area can be automatically set to an optimal value effective to suppress the noise.

According to the above mentioned present invention, the capacitance of the decoupling capacitor can be dynamically changed or controlled depending on the use environment of the circuit, to reduce the noise.

In the semiconductor device of the present invention in which the decoupling capacitance is provided between the first power supply and the second power supply, a monitoring circuit monitors and detects the noise quantity of the semiconductor device, a determining circuit determines a capacitance value of the decoupling capacitor based on the detected noise, and a control circuit controls the capacitance of the decoupling capacitor based on the determined result.

The noise is such as power supply noise having, signal noise and electromagnetic wave radiation noise. The monitoring circuit may be a voltage level monitoring circuit for power supply noise. The monitoring circuit may be a clock jitter monitoring circuit for the signal noise.

The decoupling capacitor may be a capacitance array circuit. In order to change the decoupling capacitance depending on the noise quantity, a permissible noise quantity is set, and the decoupling capacitance is changed such that the detected noise quantity falls within the permissible noise quantity. This change of the decoupling capacitance is carried out by changing the capacitance and detecting the minimum noise quantity.

Although the present invention has been described above in connection with several embodiments thereof, it will be appreciated by those skilled in the art that those embodiments are provided solely for illustrating the present invention, and should not be relied upon to construe the appended claims in a limiting sense.

What is claimed is:

1. A semiconductor device comprising:
    a monitoring circuit configured to monitor and detect a quantity of noise in said semiconductor device;
    a control circuit having capacitances and configured to control connections to said capacitances to provide a decoupling capacitance value between a first power supply and a second power supply that is dynamically adjusted based on the detected noise quantity, wherein said control circuit further includes:
    a determining circuit configured to generate a capacitance control signal from said detected noise quantity supplied from said monitoring circuit, and
    a capacitance control circuit having said capacitances and configured to control the connections to said capacitances in response to the capacitance control signal such the decoupling capacitance value provided between the first power supply and the second power supply is dynamically adjusted,
    wherein said capacitance control circuit further includes a capacitance counter configured to perform a count operation in response to said capacitance control signal, to generate an overflow signal when a count value as a result of the count operation overflows, and to generate a capacitance control end signal when the count value does not overflow, and
    said determining circuit further includes: a permissible noise counter configured to stop a count operation in response to said capacitance control end signal, and to output a permissible noise quantity which is made larger in response to said overflow signal; and
    a comparator configured to compare said detected noise quantity and said permissible noise quantity, and to output said capacitance control signal to said capacitance counter of said capacitance control circuit when said detected noise quantity does not fall within said permissible noise quantity.

2. The semiconductor device according to claim 1, wherein said capacitance control circuit comprises:
    said capacitance counter;
    a switch control circuit configured to decode of the count value of said capacitance counter to generate a switch control signal; and
    a capacitance array circuit having said capacitances and configured to connect said capacitances between said first and second power supplies in response to said switch control signal.

3. A semiconductor device comprising:
    a monitoring circuit configured to monitor and detect a quantity of noise in said semiconductor device;
    a control circuit having capacitances and configured to control connections to said capacitances to provide such a decoupling capacitance value provided between a first power supply and a second power supply that is dynamically adjusted based on the detected noise quantity, wherein said control circuit includes:
a determining circuit configured to generate a capacitance control signal from said detected noise quantity supplied from said monitoring circuit, and
a capacitance control circuit having said capacitances and configured to control the connections to said capacitances in response to the capacitance control signal such the decoupling capacitance value provided between the first power supply and the second power supply is dynamically adjusted,
wherein said capacitance control circuit further includes a capacitance counter configured to perform a count operation in response to said capacitance control signal, to hold a count value as a result of the count operation in response to a minimum noise quantity detection signal, and to set the held count value when the count value overflows, and
said determining circuit further includes: a minimum noise quantity holding circuit counter configured to hold said detected noise quantity as a minimum noise quantity in response to a minimum noise quantity detection signal; and a comparator configured to compare said minimum noise quantity and said detected noise quantity to generate said capacitance control signal and said minimum noise quantity detection signal.

4. The semiconductor device according to claim 3, wherein said capacitance control circuit comprises:
said capacitance counter;
a switch control circuit configured to decode of the count value of said capacitance counter to generate a switch control signal; and
a capacitance array circuit having said capacitances and configured to connect said capacitances between said first and second power supplies in response to said switch control signal.

5. A method of suppressing noise in a semiconductor device, comprising
monitoring and detecting a quantity of noise in said semiconductor device; and
controlling connections to capacitances to provide a decoupling capacitance value between a first power supply and a second power supply that is dynamically adjusted based on the detected noise quantity;
wherein said monitoring and detecting includes:
outputting a reference clock signal for a time period during which an internal clock signal is active;
counting said reference clock signal passed through said AND gate to output an internal clock count value; and
calculating a count value difference between an ideal internal clock count value and the internal clock count value from said counter to output a jitter quantity corresponding to the count value difference as the noise quantity.

6. A method of suppressing noise in a semiconductor device, comprising:
monitoring and detecting a quantity of noise in said semiconductor device; and
controlling connections to capacitances to provide a decoupling capacitance value between a first power supply and a second power supply that is dynamically adjusted based on the detected noise quantity;
wherein said monitoring and detecting includes:
frequency-dividing an internal clock signal;
outputting a reference clock signal for a time period during which the frequency-divided internal clock signal is active;
counting said reference clock signal to output an internal clock count value; and
calculating a count value difference between an ideal internal clock count value and the internal clock count value to output a jitter quantity corresponding to the count value difference as the noise quantity.

* * * * *